(12) United States Patent
Matsumoto

(10) Patent No.: US 12,100,714 B2
(45) Date of Patent: Sep. 24, 2024

(54) SEMICONDUCTOR DEVICE AND SEMICONDUCTOR DEVICE IDENTIFICATION METHOD

(71) Applicant: ROHM CO., LTD.

(72) Inventor: Naoki Matsumoto, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 18/341,718

(22) Filed: Jun. 26, 2023

(65) Prior Publication Data

US 2023/0343795 A1    Oct. 26, 2023

Related U.S. Application Data

(63) Continuation of application No. 16/971,556, filed as application No. PCT/JP2019/009343 on Mar. 8, 2019, now Pat. No. 11,735,599.

(30) Foreign Application Priority Data

Mar. 12, 2018   (JP) ................... 2018-044398

(51) Int. Cl.
   *H01L 27/12*    (2006.01)
   *G01R 31/28*    (2006.01)
   *H01L 21/822*   (2006.01)

(52) U.S. Cl.
   CPC .......... *H01L 27/124* (2013.01); *G01R 31/28* (2013.01); *H01L 21/822* (2013.01); *H01L 27/1225* (2013.01)

(58) Field of Classification Search
   CPC . H01L 27/124; H01L 21/822; H01L 27/1225; H01L 2223/5444; H01L 23/544; G01R 31/28; G01R 31/2818
   See application file for complete search history.

(56) References Cited

U.S. PATENT DOCUMENTS

| 2007/0210836 | A1  | 9/2007 | Laulanet |
|---|---|---|---|
| 2009/0079456 | A1* | 3/2009 | Cases ............... G11C 29/028 324/762.06 |
| 2016/0258821 | A1* | 9/2016 | Tsurumaru ............ G01K 7/42 |

FOREIGN PATENT DOCUMENTS

| JP | 58-176966 A | 10/1983 |
|---|---|---|
| JP | 60-107852 A | 6/1985 |

(Continued)

OTHER PUBLICATIONS

International Search Report issued in PCT/JP2019-009343, May 28, 2019 (2 pages).

(Continued)

*Primary Examiner* — Benjamin Tzu-Hung Liu
(74) *Attorney, Agent, or Firm* — HSML P.C.

(57) ABSTRACT

A semiconductor device 1a includes: a first external terminal 31 to which a first voltage is to be applied; a second external terminal 32 to which a second voltage is to be applied; a third external terminal 33; first wiring 17 connected to the first external terminal 31; second wiring 18 connected to the second external terminal 32; an internal block circuit 11 connected to the first wiring 17; a first resistor 12 and a transistor 14 serially connected between the first wiring 17 and the second wiring 18; and a second resistor 13 connected between the first wiring 17 and the second wiring 18. The transistor 14 turns on or off based on a test signal fed from the third external terminal 33. This configuration enables product identification using a resistance value, even if a predetermined resistance value cannot be changed.

16 Claims, 16 Drawing Sheets

(56) References Cited

FOREIGN PATENT DOCUMENTS

| | | | |
|---|---|---|---|
| JP | 9-101347 A | | 4/1997 |
| JP | 11-109002 A | | 4/1999 |
| JP | 2002-368110 A | | 12/2002 |
| JP | 2004-327602 A | | 11/2004 |
| JP | 2010-171369 A | | 8/2010 |
| JP | 2013-108786 A | | 6/2013 |
| JP | 2014-90357 A | | 5/2014 |
| JP | 2014090357 | * | 5/2014 |
| JP | 2014090357 A | * | 5/2014 |
| JP | 2015-68810 A | | 4/2015 |

OTHER PUBLICATIONS

Office Action received in the corresponding Japanese patent application, Jul. 5, 2022, and machine translation (6 pages).
Office Action received in the corresponding Chinese patent application, Sep. 28, 2022 and machine translation (23 pages).
Office Action received in the corresponding Chinese patent application, Apr. 14, 2023 and machine translation (10 pages).
Office Action received in the corresponding Japanese patent application, Oct. 25, 2022, and machine translation (8 pages).
Office Action received in the corresponding Japanese Patent application, Feb. 6, 2024, and machine translation (11 pages).

* cited by examiner

SEMICONDUCTOR DEVICE AND SEMICONDUCTOR DEVICE IDENTIFICATION METHOD

TECHNICAL FIELD

The present invention relates to a semiconductor device and a semiconductor device identification method.

BACKGROUND ART

Semiconductor devices have markings on their resin surfaces for enabling the product types of the individual devices to be identified. Some semiconductor devices of different configurations or electrical properties may appear to be identical when they are packaged. In addition, the markings on the semiconductor devices may be hidden from view when they are mounted on substrates, making it difficult to identify the product types of the semiconductor devices. In one method for product identification in such a situation, a semiconductor device is provided with a resistor element having a specific resistance value associated with corresponding the product type, and the resistance value of the resistor element is measured at external terminals (see Patent document 1, for example).

PRIOR ART DOCUMENT

Patent Document

Patent Document 1: JP-A-2015-68810

SUMMARY OF THE INVENTION

Technical Problem

Some semiconductor devices may be provided with a resistance element having a predetermined resistance value that is not allowed to be changed due to the specifications (electrical properties) of the semiconductor device. In such a case adjusting the resistance value to enable the product identification is difficult.

The present disclosure aims to provide a semiconductor device and a method for identification of a semiconductor device both of which enable product identification by a resistance value even if the predetermined resistance value cannot be changed.

Solution to Problem

A first aspect of the present disclosure provides a semiconductor device including: a first external terminal to which a first voltage is to be applied; a second external terminal to which a second voltage is to be applied; a third external terminal; first wiring connected to the first external terminal; second wiring connected to the second external terminal; a first internal block circuit connected to the first wiring; a first resistor and a first switching element serially connected between the first wiring and the second wiring; and a second resistor connected between the first wiring and the second wiring. The first switching element turns on or off based on a test signal to be applied to the third external terminal.

A second aspect of the present disclosure provides a semiconductor device including: a first external terminal to which a first voltage is to be applied; a second external terminal to which a second voltage is to be applied; a third external terminal; first wiring connected to the first external terminal; second wiring connected to the second external terminal; a first internal block circuit connected to the first wiring; a first resistor and a first switching element serially connected between the first wiring and the second wiring; and a second resistor connected between the first wiring and the second wiring.

A third aspect of the present disclosure provides a method for identifying a semiconductor device. The method is for product identification of the semiconductor device. The method includes: a first step of turning off the first switching element; and a second step of detecting a resistance value of the second resistor based on a voltage between the first external terminal and the second external terminal.

MODE FOR CARRYING OUT THE INVENTION

Embodiments of semiconductor devices will be described below with reference to the drawings. The embodiments are provided for the purpose of illustrating some configurations and implementations for embodying the technical ideas and not intended to limit the materials, shapes, structures, arrangements, dimensions etc., to those described below. Various changes may be made to the embodiments described below.

As used herein, "an element A is connected to an element B" means that the elements A and B are physically and directly connected to each other or the elements A and B are indirectly connected via another element not affecting the electrical communication between them.

Similarly, "an element C is between elements A and B" used herein means the elements A and C or the elements B and C are directly connected to each other or they are indirectly connected via another element not affecting the electrical communication between them.

First Embodiment

Figure 1:
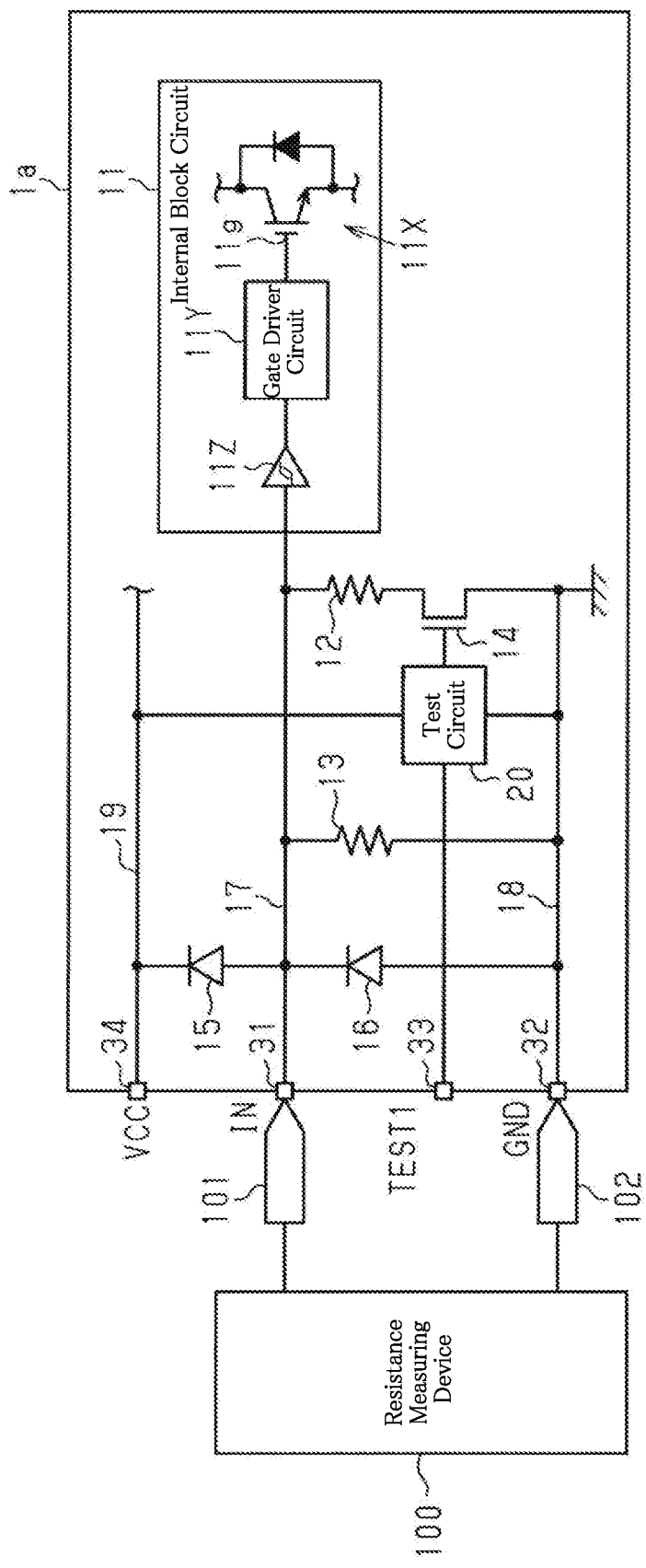
FIG. 1 is a circuit diagram of a semiconductor device according to a first embodiment.
Figure 2:
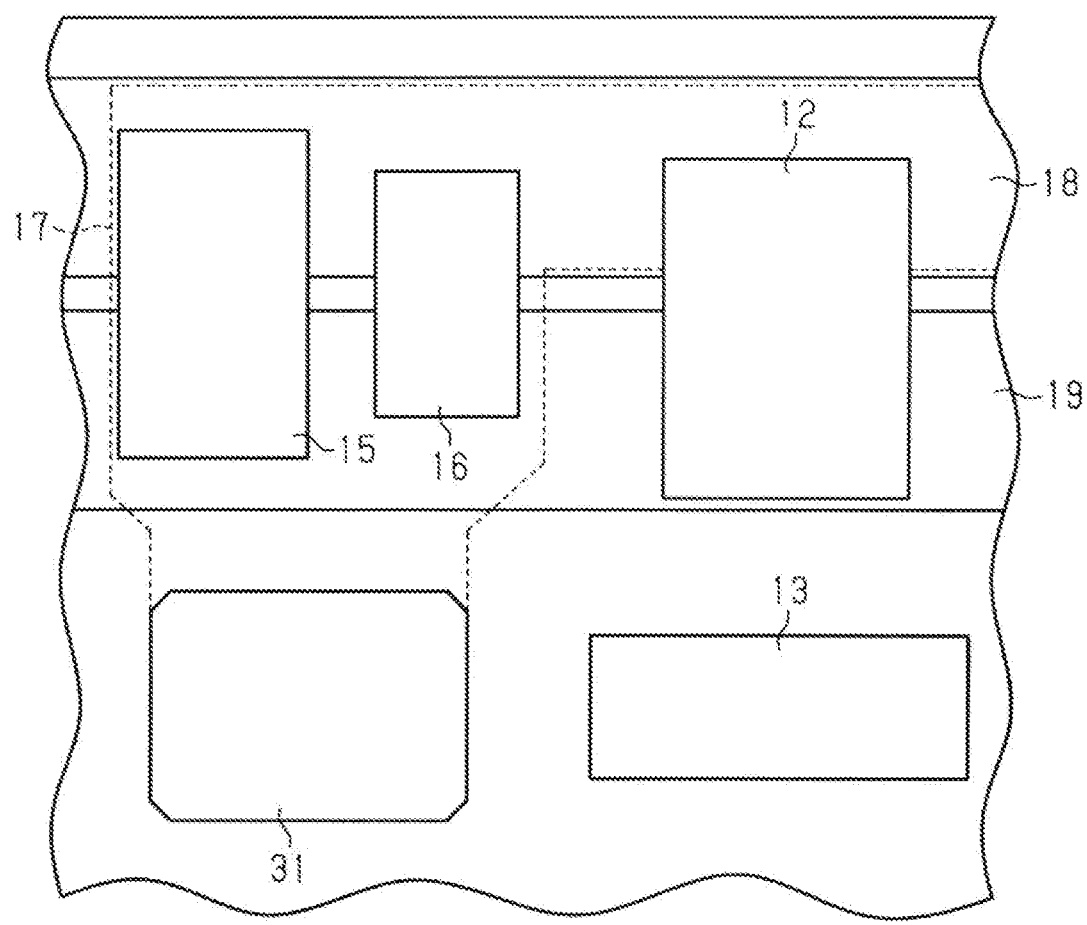
FIG. 2 shows a layout of a portion of the semiconductor device shown in FIG. 1.

With reference to FIGS. 1 and 2, a semiconductor device 1a according to a first embodiment will be described. FIG. 1 shows a circuit diagram of a major part of the semiconductor device 1a and also shows a schematic configuration of a resistance measuring device 100. In one example, the resistance measuring device 100 may be a hand-held tester.

The semiconductor device 1a is a module composed of a plurality of electrical elements, such as transistors and resistors, sealed with a sealing resin. In the example shown in FIG. 1, the semiconductor device 1a includes an internal block circuit 11, which is an example of a first internal block circuit, a first resistor 12, a second resistor 13, a transistor 14, which is an example of a first switching element, a first diode 15, a second diode 16, first wiring 17, second wiring 18, third wiring 19 and a test circuit 20, which is an example of a first test circuit.

The semiconductor device 1a also includes a plurality of terminals extending out of the sealing resin, including a first external terminal 31, a second external terminal 32, a third external terminal 33, which is an example of an external sensor terminal, and a fourth external terminal 34. The first external terminal 31 is an input terminal to which a control signal is inputted for controlling the internal block circuit 11 of the semiconductor device 1a. The second external terminal 32 is a GND terminal. The third external terminal 33 outputs a fault signal to the outside, upon detection of a fault in the semiconductor device 1a. Also, the third external terminal 33 of this embodiment receives a test signal applied for identifying the product type of the semiconductor device 1a vice 1a or checking the electrical property. The fourth external terminal 34 is a terminal to which a source voltage VCC is applied. The first external terminal 31 is connected to the first wiring 17, the second external terminal 32 is connected to the second wiring 18, and the fourth external terminal 34 is connected to the third wiring 19. The first wiring 17 receives a first voltage applied at the first external terminal 31 for inputting a control signal. In one example, the first voltage is a control voltage of 3.3 to 5.0 volts. The second wiring 18 receives a second voltage at ground potential via the second external terminal 32.

The internal block circuit 11 may include a power transistor 11X, a gate driver circuit 11Y for driving the power transistor 11X, and a Schmitt trigger 11Z. The gate driver circuit 11Y is connected between the power transistor 11X and the Schmitt trigger 11Z. The power transistor 11X may be an insulated gate bipolar transistor (IGBT), for example. The control terminal of the power transistor 11X is a gate terminal 11g connected to the first wiring 17. The power transistor 11X may be an MOSFET or any other transistor. The control terminal of the power transistor 11X receives a gate control signal, which is pluses inputted at a frequency of 2 kHz or higher, via the first external terminal 31 and the gate driver circuit 11Y. In one example, the frequency of the gate control signal is preferably within a range of 5 KHZ to 20 KHZ, both inclusive.

The first resistor 12 and the transistor 14 as a switching element are serially connected between the first wiring 17 and the second wiring 18. The transistor 14 may be an NMOSFET, for example. The source of the transistor 14 is connected to the second wiring 18, and the gate, which is an example of the control terminal, of the transistor 14 is connected to the third external terminal 33 via the test circuit 20.

The second resistor 13 is connected between the first wiring 17 and the second wiring 18. When the transistor 14 is on, the first resistor 12 and the second resistor 13 are connected between the first wiring 17 and the second wiring 18. In other words, the first resistor 12 and the second resistor 13 are connected in parallel to each other. The parallel-connected first resistor 12 and second resistor 13 have a combined resistance matching the predetermined resistance value specified by the specifications of the semiconductor device 1a. In one example, the specified resistance value is 5 kΩ.

When the transistor 14 is off, only the second resistor 13 is kept connected between the first wiring 17 and the second wiring 18. The second resistor 13 has a resistance value determined based on the specifications (electrical properties) of the semiconductor device 1a and used for identifying the product type of the semiconductor device 1a. In addition, the first resistor 12 has a resistance value determined so that the combined resistance of the first resistor 12 and the second resistor 13 matches the specified resistance value.

To be more specific, first, the resistance value of the second resistor 13 is determined based on the specifications of the semiconductor device 1a. Then, the resistance value of the first resistor 12 is determined to match the specified resistance value when combined with the second resistor 13. In one example, the resistance value of the first resistor 12 is 5.03 kΩ, and the resistance value of the second resistor 13 is 800 kΩ. In another example, the resistance value of the first resistor 12 is 5.26 kΩ, and the resistance value of the second resistor 13 is 100 kΩ.

In one example, each of the first resistor 12 and the second resistor 13 may be a polysilicon resistor. The second resistor 13 has a larger resistance value than the first resistor 12. The resistance of a polysilicon resistor depends on the ion implantation dose. For instance, the amount of ions in the second resistor 13 is less than the amount of ions in the first resistor 12.

The first diode 15 and the second diode 16 are provided for electrostatic protection of the internal block circuit 11. The cathode of the first diode 15 is connected to the third wiring 19, and the anode of the first diode 15 is connected to the first wiring 17. The cathode of the second diode 16 is connected to the first wiring 17, and the anode of the second diode 16 is connected to the second wiring 18.

The test circuit 20 is connected to each of the third wiring 19, the third external terminal 33, and the control terminal (gate) of the transistor 14. The test circuit 20 controls on and off of the transistor 14 according to the state of the third external terminal 33. For example, when the source voltage VCC is supplied but no test signal is applied to the third external terminal 33 (open state), the test circuit 20 turns on the transistor 14. On the other hand, when the source voltage VCC is supplied and a test signal of a predetermined level is applied to the third external terminal 33, the test circuit 20 supplies a gate signal voltage to the gate of the transistor 14, thereby turning off the transistor 14.

The circuit of FIG. 1 may be implemented as an IC, and the layout of the first resistor 12, the second resistor 13, the first diode 15, the second diode 16 and the first external terminal 31 for such a circuit is described below. FIG. 2 shows one example of the layout of the first resistor 12, the second resistor 13, the first diode 15, the second diode 16 and the first external terminal 31.

In the module of the semiconductor device 1a, the second wiring 18 and the third wiring 19 are located closer to the module edge than the first external terminal 31. The second wiring 18 is located closer to the module center of the semiconductor device 1a than the third wiring 19. The second wiring 18 and the third wiring 19 extend in parallel to each other.

The first diode 15, the second diode 16 and the first resistor 12 are located closer to the module edge of the semiconductor device 1a than the first external terminal 31. The first diode 15, the second diode 16 and the first resistor 12 are connected to the first wiring 17, which is connected to the first external terminal 31. On the first wiring 17, the first diode 15, the second diode 16 and the first resistor 12 are located in the order closer to the first external terminal 31.

The second resistor 13 is connected to the first wiring 17 not shown in the figure. The second resistor 13 is connected to the first wiring 17 at a location farther from the first external terminal 31 than the first resistor 12. As is clear from FIG. 3, the second resistor 13 has a smaller area than the first resistor 12.

Next, the following describes operation of the semiconductor device 1a with reference to FIG. 1. The semiconductor device 1a has a normal mode for normal operation and a test mode for product identification of the semiconductor device 1a by the resistance measuring device 100.

In the normal mode, the source voltage VCC is applied to the third wiring 19 via the fourth external terminal 34. According to the logic input to the first external terminal 31, a drive voltage is applied via a drive voltage terminal to turn on or off the power transistor 11X. In the normal mode, no test signal is applied to the third external terminal 33, and the test circuit 20 thus turns on the transistor 14. As a result, the first resistor 12 is connected in parallel to the second resistor 13, so that the combined resistance of the parallel-connected first resistor 12 and second resistor 13 pulls down the first external terminal 31 toward the level of the second wiring 18. The resistance value of the combined resistance that pulls down the first external terminal 31 is equal to the predetermined resistance value required by the specifications of the semiconductor device 1a.

In the test mode, the source voltage VCC is applied to the third wiring 19 via the fourth external terminal 34. In addition, a first probe 101 of the resistance measuring device 100 is connected to the first external terminal 31, and a second probe 102 to the second external terminal 32. In this state, a test signal is inputted to the third external terminal 33, in response to which the test circuit 20 turns off the transistor 14. The resistance measuring device 100 then measures the resistance value of the second resistor 13 between the first external terminal 31 and the second external terminal 32. The product type of the semiconductor device 1a can be identified based the measured resistance value of the second resistor 13. To be more specific, semiconductor devices of identical packages (modules) may differ in the specifications, such as configurations or electrical property values of the electrical elements. Each of such a semiconductor device has a second resistor 13 set to a resistance value unique to the type of devices having the same specifications. Thus, acquiring the resistance value of the second resistor 13 enables the specifications of the semiconductor device 1a to be identified. In the test mode, the test circuit 20 deactivates the first resistor 12, leaving only the second resistor 13 active. Then, the resistance value of the second resistor 13 can be measured by the resistance measuring device 100. The product type of the semiconductor device 1a can be identified by the measured resistance value of the second resistor 13. In this way, in the test mode of performing product identification of the semiconductor device 1a, a method of identifying the semiconductor device 1a includes a first step of turning off the transistor 14 and a second step of measuring the resistance value of the second resistor 13 between the first external terminal 31 and the second external terminal 32.

Without the source voltage VCC applied to the third wiring 19, the test circuit 20 does not operate. As a result, no gate signal voltage is applied to the gate of the transistor 14 and thus the transistor 14 is turned off. In this state, by connecting the first probe 101 to the first external terminal 31 and the second probe 102 to the second external terminal 32 as in the test mode described above, the resistance measuring device 100 can measure the resistance value of only the second resistor 13 connected between the first external terminal 31 and the second external terminal 32. The product type of the semiconductor device 1a can be identified based on the measured resistance value of the second resistor 13. In this way, the product identification of the semiconductor device 1a is feasible by using the resistance measuring device 100 without the source voltage VCC.

The present embodiment can achieve the following advantages.

(1-1) In the normal mode, the first resistor 12 is activated by turning on the transistor 14, so that the predetermined resistance value (5 kΩ) required by the specifications of the semiconductor device 1a is provided by the combined resistance of the first resistor 12 and the second resistor 13. When the source voltage VCC is not applied, the transistor 14 is off. Thus, among the first resistor 12 and the second resistor 13, only the second resistor 13 is connected between the first wiring 17 and the second wiring 18. In this state, the resistance value of the second resistor 13 can be measured by the resistance measuring device 100 from the voltage between the first external terminal 31 and the second external terminal 32. In the test mode, when the transistor 14 is off, the resistance value of the second resistor 13 can be measured by the resistance measuring device 100 from the voltage between the first external terminal 31 and the second external terminal 32. Therefore, the second resistor 13 can be designed to have any resistance value unique to the type of specifications (electrical properties) of the semiconductor device 1a, so that the semiconductor device 1a can be identified by the resistance value of the second resistor 13. That is, for product identification of the semiconductor device 1a, use may be made of a resistor having a predetermined resistance value which can pull down the level of the first external terminal 31. In this way, the semiconductor device 1a can be identified by using such a resistance value even in a case where a certain resistance value should not be changed.

(1-2) The second resistor 13 has a resistance value smaller than the resistance value of the first resistor 12. This means that the second resistor 13 has a smaller area than the area of the first resistor 12, which is effective for reducing the size of the semiconductor device 1a.

(1-3) The first wiring 17 has a shorter length between the first external terminal 31 and the first resistor 12 than between the first external terminal 31 and the second resistor 13. In this configuration, the first resistor 12, which is effective to suppress surges in external voltage of the semiconductor device 1a, is located near the first external terminal 31. This can reduce the influence on the first resistor 12 induced by the resistance or inductance of the first wiring 17 connecting the first resistor 12 and the first external terminal 31.

Second Embodiment

Figure 3:
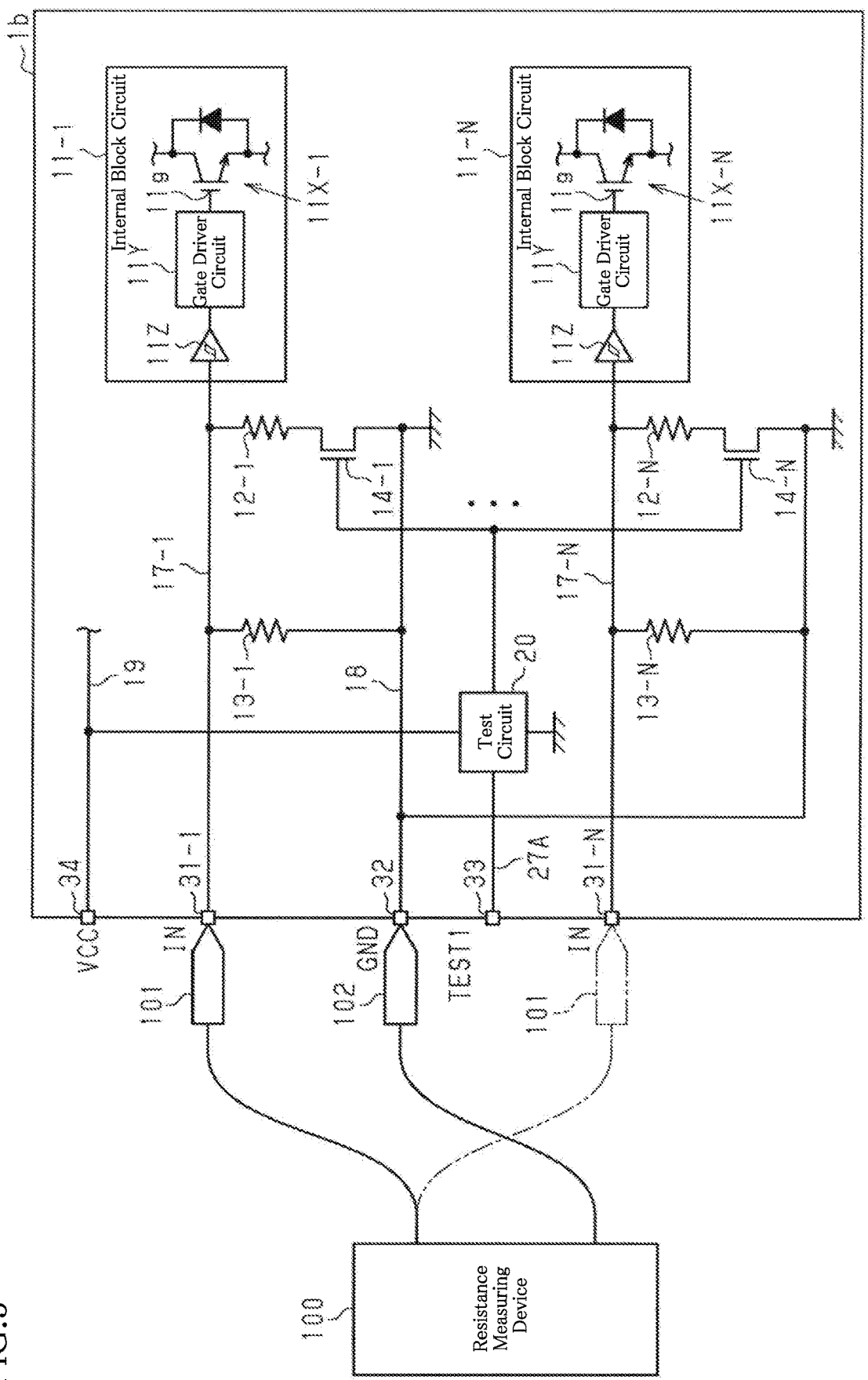
FIG. 3 is a circuit diagram of a semiconductor device according to a second embodiment.

With reference to FIG. 3, a semiconductor device 1b according to a second embodiment will be described. In the description of this embodiment, components similar to those of the first embodiment are denoted by the same reference signs and a description thereof may be omitted partly or entirely.

The semiconductor device 1b of this embodiment differs from the semiconductor device 1a of the first embodiment in that each of the following components is provided in plurality: the first external terminal 31, the second external terminal 32, the internal block circuit 11, the first resistor 12, the second resistor 13, the first wiring 17 and the second wiring 18. For convenience of description, FIG. 3 omits the first diode 15 and the second diode 16.

As shown in FIG. 3, the semiconductor device 1b includes N number of internal block circuits 11, N number of first resistors 12, N number of second resistors 13, N number of pieces of first wiring 17 and N number of first external terminals 31. FIG. 3 denotes each of a plurality of same components by a common reference number (e.g., "11" for the internal block circuits) with the suffix (1 to N) for distinguishing the individual components.

The semiconductor device 1b also includes one piece of second wiring 18, one second external terminal 32, one third external terminal 33, and one fourth external terminal 34 and one test circuit 20. The test circuit 20 is connected to the control terminal of each of the transistors 14-1, . . . 14-N. The test circuit 20 outputs a control signal to the control terminal of each of the transistors 14-1, . . . 14-N. The third external terminal 33 is connected to the test circuit 20 via wiring 27A. The fourth external terminal 34 is connected to third wiring 19. The test circuit 20 is connected to the third wiring 19.

At least one of the N number of second resistors 13-1, . . . 13-N has a resistance value unique to the product type of the semiconductor device 1b. On the other hand, the combined resistances of the pairs of corresponding resistors, namely the combined resistance of the first resistor 12-1 and the second resistor 13-1, . . . the combined resistance of the first resistor 12-N and the second resistor 13-N, are all equal. Also, as in the first embodiment, the value of the combined resistance is equal to the predetermined resistance value required by the specifications of the semiconductor device 1b. In one example, the resistance value of the combined resistance is 5 kΩ. The resistance value of each of the first resistors 12-1, . . . 12-N is determined according to the resistance value of a corresponding second resistor 13-1, . . . 13-N and the specified value.

Next, operation of the semiconductor device 1b will be described. In the normal mode, the source voltage VCC is applied to the third wiring 19 via the fourth external terminal 34. According to the logic input to each of the first external terminals 31-1, . . . 31-N, a drive voltage is applied via a drive voltage terminal to turn on or off a corresponding one of the power transistors 11X-1, . . . 11X-N. In the normal mode, no test signal is applied to the third external terminal 33, and the test circuit 20 thus turns on each of transistors 14-1, . . . 14-N. As a result, the first resistors 12-1, . . . 12-N are respectively connected in series with the second resistors 13-1, . . . 13-N, and the combined resistance of each serially-connected first resistor 12-1, . . . 12-N and second resistors 13-1, . . . 13-N pulls down a corresponding one of the first external terminals 31-1, . . . 31-N to the level of the second wiring 18. The resistance value of the combined resistance that pulls down each of the first external terminal 31-1, . . . 31-N is equal to the predetermined resistance value specified by the specifications of the semiconductor device 1a.

In the test mode or where the source voltage VCC is not applied to the third wiring 19, the transistor 14-1, . . . 14-N are turned off. As a result, among the first resistors 12-1 . . . 12-N and the second resistors 13-1, . . . 13-N, only the second resistors 13-1, . . . 13-N are connected between the first wiring 17 and the second wiring 18. Next, the first probe 101 of the resistance measuring device 100 is connected to the first external terminal 31-1 and the second probe 102 is connected to the second external terminal 32 to measure the resistance value of the second resistor 13-1. Then, with the second probe 102 kept connected to the second external terminal 32, the first probe 101 of the resistance measuring device 100 is sequentially connected to the first external terminals 31-2, . . . 31-N to sequentially measure the second resistor 13-2, . . . second resistor 13-N.

The product type of the semiconductor device 1b can be identified using the resistance values of the second resistors 13-1, . . . 13-N in combination. To be more specific, the resistance values of the second resistor 13-1, . . . 13-N are measured by the resistance measuring device 100. Then, the obtained set of resistance values is compared with a number of predetermined sets of resistance values for second resistors 13-1, . . . 13-N so as to seek a match. The match found reveals the product type of the semiconductor device 1b since each of the predetermined sets of resistance values is associated with particular specifications of the semiconductor device 1b.

The present embodiment can achieve the following advantages in addition to those achieved by the first embodiment.

(2-1) Since the semiconductor device 1b is identified by a combination the resistance values of a plurality of second resistors 13, a greater number of resistance values can be used for product identification of a greater number of types of semiconductor devices 1b. This enables the identification of a wider variety of semiconductor devices 1b of identical packages.

Third Embodiment

Figure 4:
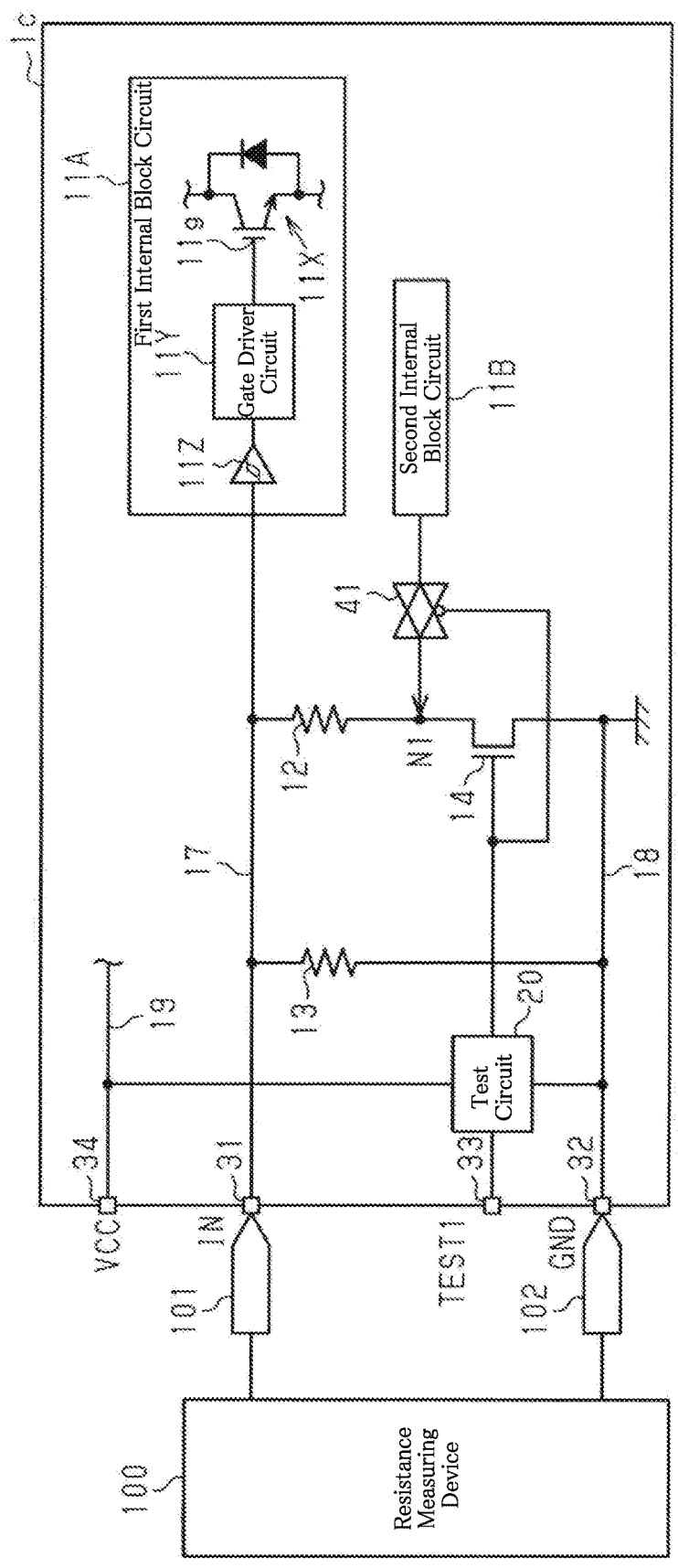
FIG. 4 is a circuit diagram of a semiconductor device according to a third embodiment.
Figure 5:
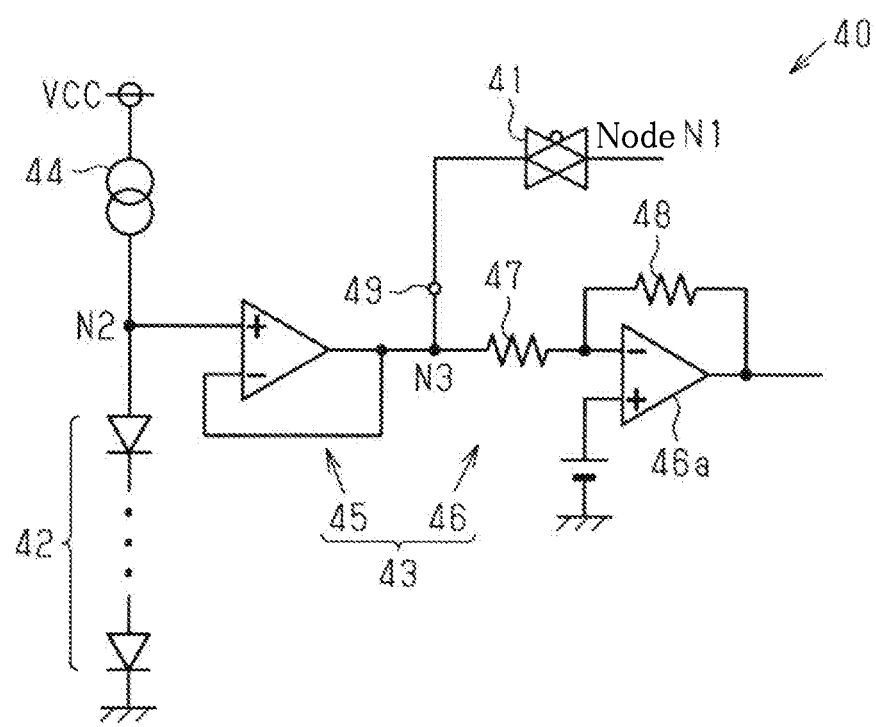
FIG. 5 is a circuit diagram of an example of the second internal block circuit shown in FIG. 4.

With reference to FIGS. 4 and 5, a semiconductor device 1c according to a third embodiment will be described. In the description of this embodiment, components similar to those of the first embodiment are denoted by the same reference signs and a description thereof may be omitted partly or entirely.

The semiconductor device 1c of the present embodiment includes a first internal block circuit 11A and a second internal block circuit 11B. The first internal block circuit 11A has the same configuration as the internal block circuit 11 of the first embodiment.

Unlike the first internal block circuit 11A, the second internal block circuit 11B has circuitry for a control system. The second internal block circuit 11B operates on the source voltage VCC, for example.

As shown in FIG. 4, the semiconductor device 1c has an analog switch 41, which is one example of a switching unit. The analog switch 41 has a first terminal connected to the second internal block circuit 11B. The analog switch 41 also has a second terminal connected to a node N1 connecting the first resistor 12 and the drain of the transistor 14. The analog switch 41 may include a PMOSFET and an NMOSFET connected to each other in parallel and configured to turn on or off in a complementary relation with the transistor 14. Alternatively, the analog switch 41 may include only one of a PMOSFET and an NMOSFET only.

In one example, the second internal block circuit 11B is a temperature measurement circuit 40 as shown in FIG. 5. The temperature measurement circuit 40 measures the temperature of a driver IC for the power transistor 11X and includes an analog temperature sensor (hereinafter "temperature sensor 42"), a signal transmission circuit 43 and a constant-current source 44.

The temperature sensor 42 includes a plurality of diodes connected in series. The anode of a diode is connected to the constant-current source 44, and the cathode of another diode is connected to ground. The constant-current source 44 is connected to the third wiring 19 (see FIG. 5).

The signal transmission circuit 43 includes a voltage follower circuit 45 and an inverting amplifier circuit 46. The voltage follower circuit 45 has a first input terminal connected to a node N2 connecting the constant-current source 44 and the temperature sensor 42. The voltage follower circuit 45 has a second input terminal connected to the output terminal of the voltage follower circuit 45.

The inverting amplifier circuit 46 includes resistors 47 and 48 and an operational amplifier 46a. The operational amplifier 46a has an inverting input terminal connected to the output terminal of the voltage follower circuit 45 via the resistor 47. The resistor 48 is connected between the inverting input terminal and the output terminal of the operational amplifier 46a. The non-inverting input terminal of the operational amplifier 46a is connected to receive a reference voltage.

The analog switch 41 has a first terminal connected to a sensing terminal 49 that is connected to a node N3 between the voltage follower circuit 45 and the inverting amplifier circuit 46. Thus, the output voltage of the temperature sensor 42 is inputted to the analog switch 41.

Next, operation of the semiconductor device 1c will be described. The semiconductor device 1c has a normal mode for normal operation, a first test mode for product identification of the semiconductor device 1c by the resistance measuring device 100, and a second test mode for measurement of the internal voltage of the second internal block circuit 11B by a voltage measuring device (not shown).

In the normal mode, operation of the semiconductor device 1c is similar to the normal mode operation of the semiconductor device 1a of the first embodiment. In this mode, the analog switch 41 is off. Also, operation of the semiconductor device 1c in the first test mode is similar to the test mode operation of the semiconductor device 1a of the first embodiment. To be more specific, without the source voltage VCC applied to the fourth external terminal 34, the test circuit 20 and the second internal block circuit 11B do not operate, so that the transistor 14 is off and the analog switch will not turn on 41. In this state, the resistance value of the second resistor 13 connected between the first external terminal 31 and the second external terminal 32 can be measured by the resistance measuring device 100 as in the test mode of the first embodiment, by connecting the first probe 101 to the first external terminal 31 and the second probe 102 to the second external terminal 32. The product type of the semiconductor device 1a can be identified based on the measured value of the second resistor 13. In this way, the product identification of the semiconductor device 1c is feasible by using the resistance measuring device 100 without the source voltage VCC.

When the source voltage VCC is applied to the fourth external terminal 34, however, the test mode signal is inputted only from the third external terminal 33. This does not cause both the transistor 14 and the analog switch 41 to be off. Thus, product identification cannot be conducted.

In the second test mode, the source voltage VCC is applied to the fourth external terminal 34. In this state, in response to a test mode signal inputted from the third external terminal 33, the test circuit 20 turns off the transistor 14 and turns on the analog switch 41. As a result, the analog switch 41 passes the internal voltage of the second internal block circuit 11B to the node N1 between the first resistor 12 and the transistor 14. This internal voltage appears at the first external terminal 31. Thus, the voltage measuring device can measure the internal voltage of the second internal block circuit 11B by measuring the voltage between the first external terminal 31 and the second external terminal 32. As described above, the method of testing the semiconductor device 1c in the second test mode includes a first step of turning off the transistor 14 and the turning on the analog switch 41, and a second step of detecting the voltage of the second internal block circuit 11B based on the voltage between the first external terminal 31 and the second external terminal 32.

The present embodiment can achieve the following advantages in addition to those achieved by the first embodiment.

(3-1) In the second test mode, the internal voltage of the second internal block circuit 11B can be measured at the first external terminal 31 and the second external terminal 32, which may be used for pre-shipment inspection of the second internal block circuit 11B.

Fourth Embodiment

Figure 6:
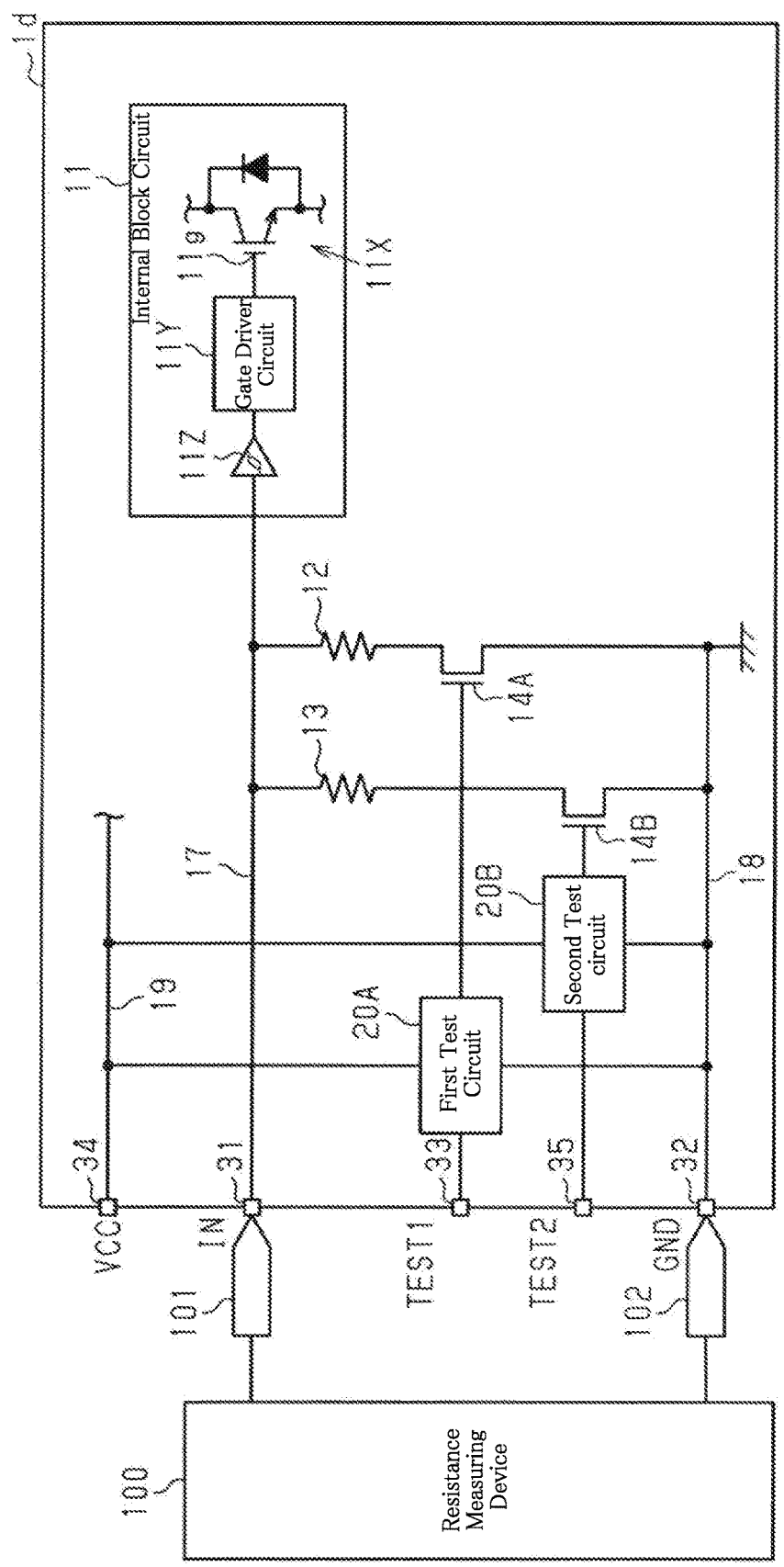
FIG. 6 is a circuit diagram of a semiconductor device according to a fourth embodiment.

With reference to FIG. 6, a semiconductor device 1d according to a fourth embodiment will be described. In the description of this embodiment, components similar to those of the first embodiment are denoted by the same reference signs and a description thereof may be omitted partly or entirely.

The semiconductor device 1d according to this embodiment includes a first transistor 14A, which is an example of a first switching element, a second transistor 14B, which is an example of a second switching element, a first test circuit 20A, a second test circuit 20B and a fifth external terminal 35. The first transistor 14A has the same configuration as the transistor 14 of the first embodiment, and the first test circuit 20A has the same configuration as the test circuit 20 of the first embodiment.

As shown in FIG. 6, the second transistor 14B is connected between the second resistor 13 and the second wiring 18. In one example, the second transistor 14B may be an NMOSFET. The second resistor 13 and the second transistor 14B are serially connected between the first wiring 17 and the second wiring 18.

The first test circuit 20A is connected to each of the third wiring 19, the third external terminal 33, and the control terminal (gate) of the first transistor 14A. The first test circuit 20A controls on and off of the first transistor 14A based on a test signal input to the third external terminal 33.

The second test circuit 20B is connected to each of the third wiring 19, the fifth external terminal 35, and the control terminal (gate) of the second transistor 14B. The second test circuit 20B controls on and off of the second transistor 14B based on a test signal input to the fifth external terminal 35. The second test circuit 20B may have the same configuration as the first test circuit 20A.

Next, operation of the semiconductor device 1d will be described. The semiconductor device 1d has a normal mode for normal operation and a first to third test modes. The first test mode is for product identification of the semiconductor device 1d by the resistance measuring device 100. The second test mode is for leakage current measurement by a current measuring device (not shown) to measure the leakage current from the gate terminal 11g of the Schmitt trigger 11Z in the first internal block circuit 11A to the first wiring 17. The third test mode is for measuring the resistance value of the first resistor 12 by the resistance measuring device 100.

In the normal mode, the source voltage VCC is applied to the fourth external terminal 34. In this state, by applying no test signal to either the third external terminal 33 or the fifth external terminal 35, both the first transistor 14A and the second transistor 14B are turned on. As a result, the first resistor 12 and the second resistor 13 are connected in parallel, so that the combined resistance of the parallel-connected first resistor 12 and second resistor 13 pulls down the first external terminal 31 to the level of the second wiring 18. The value of the combined resistance that pulls down the first external terminal 31 is equal to the predetermined resistance value specified by the specifications of the semiconductor device 1a.

In the first test mode, the resistance measuring device 100 is made ready by connecting the first probe 101 to the first external terminal 31 and the second probe 102 to the second external terminal 32. In addition, a test signal is applied to both the third external terminal 33 and the fifth external terminal 35. The test signal applied to the third external terminal 33 is a control signal for turning the first transistor 14A off. The test signal applied to the fifth external terminal 35 is a control signal for turning the second transistor 14B off. In addition, the source voltage VCC is applied to the fourth external terminal 34.

In the first test mode, the first test circuit 20A turns off the first transistor 14A in response to the test signal received from the third external terminal 33. As a result, among the first resistor 12 and the second resistor 13, only the second resistor 13 is connected between the first wiring 17 and the second wiring 18. Then, the resistance measuring device 100 can measure the resistance value of the second resistor 13 between the first external terminal 31 and the second external terminal 32. As shown above, the method of testing the semiconductor device 1d in the first test mode includes a first step of turning off the first transistor 14A and the turning on the second transistor 14B, and a second step of measuring the resistance value of the second resistor 13 between the first external terminal 31 and the second external terminal 32.

Similarly to the semiconductor device 1a of the first embodiment, the semiconductor device 1d has the second resistor 13 set to a resistance value unique to the type of the specifications of the semiconductor device 1d. Thus, the product type of the semiconductor device 1d can be identified using the resistance value of the second resistor 13.

In the second test mode, the current measuring device is made ready by connecting the first probe (not shown) to the first external terminal 31 and the second probe (not shown) to the second external terminal 32. In addition, a test signal is applied to both the third external terminal 33 and the fifth external terminal 35. In addition, the source voltage VCC is applied to the fourth external terminal 34.

In the second test mode, the first test circuit 20A turns off the first transistor 14A in response to the test signal from the third external terminal 33, and the second test circuit 20B turns off the second transistor 14B in response to the test signal from the fifth external terminal 35. As a result, the first wiring 17 is disconnected from the second wiring 18. Then, the resistance measuring device 100 can measure the leakage of current flowing through the first wiring 17 in the first internal block circuit 11A, more specifically the leakage current from the gate terminal 11g of the Schmitt trigger 11Z to the first wiring 17.

In the third test mode, the resistance measuring device 100 is made ready by connecting the first probe 101 to the first external terminal 31 and the second probe 102 to the second external terminal 32. In addition, a test signal is applied only to the fifth external terminal 35. The source voltage VCC is applied to the fourth external terminal 34.

In the third test mode, the second test circuit 20B turns off the second transistor 14B in response to the test signal received from the fifth external terminal 35. As a result, among the first resistor 12 and the second resistor 13, only the first resistor 12 is connected between the first wiring 17 and the second wiring 18. Then, the resistance measuring device 100 can measure the resistance value of the first resistor 12 between the first external terminal 31 and the second external terminal 32.

The present embodiment can achieve the following advantages in addition to those achieved by the first embodiment.

(4-1) When there is a current path (e.g., resistor) connecting the first wiring 17 and the second wiring 18, a current flows from the first wiring 17 to the second wiring 18. In this state, it is not possible to measure the leakage current from the gate terminal 11g of the Schmitt trigger 11Z to the first wiring 17. In view of this, the present embodiment provides the second test mode in which both the transistors 14A and 14B are turned off, disconnecting the current path between the first wiring 17 and the second wiring 18. In this state, the leakage current from the Schmitt trigger 11Z can be accurately measured by measuring the current through the first wiring 17.

Fifth Embodiment

Figure 7:
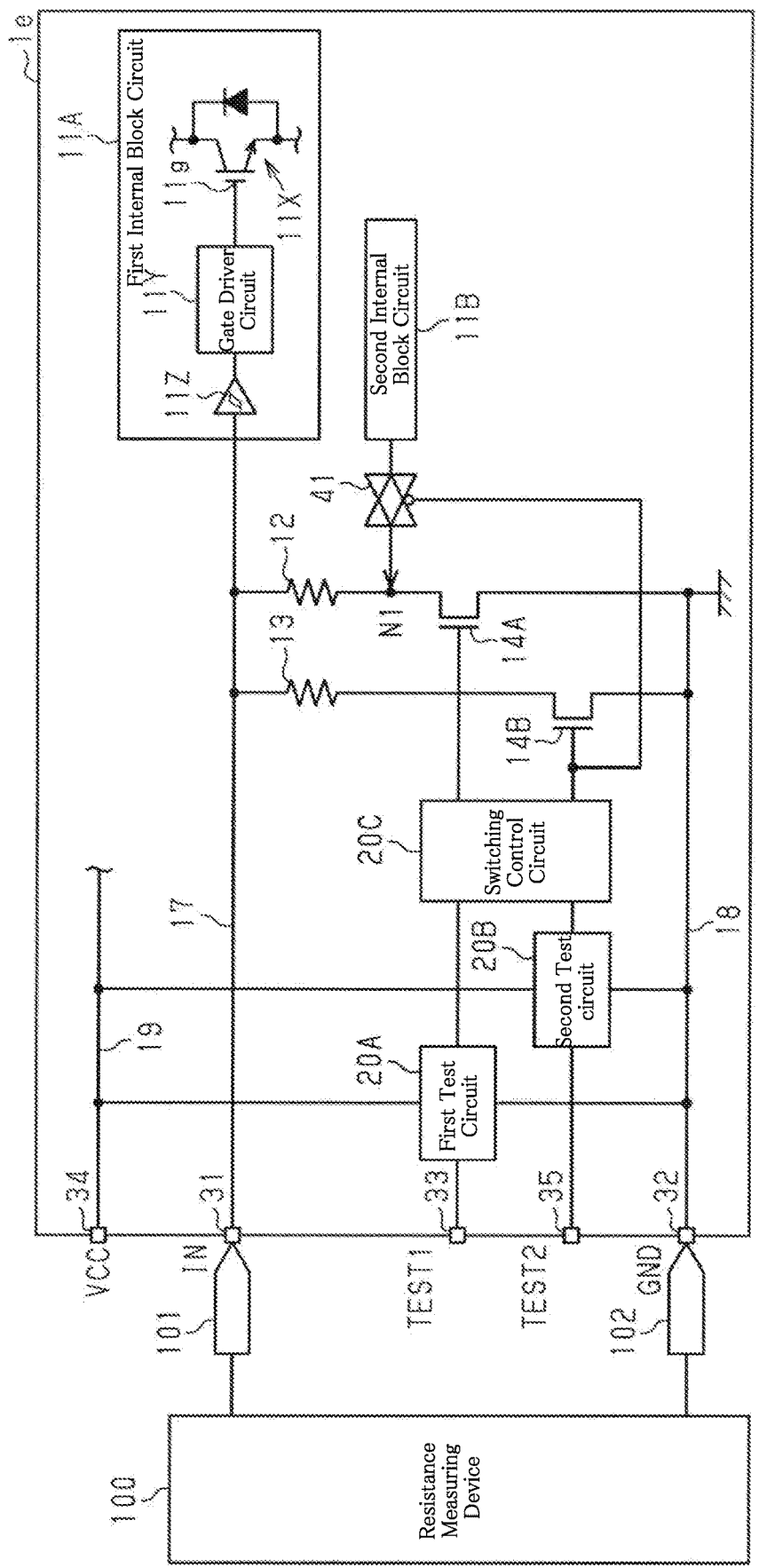
FIG. 7 is a circuit diagram of a semiconductor device according to a fifth embodiment.

With reference to FIG. 7, a semiconductor device 1e according to a fifth embodiment will be described. In the description of this embodiment, components similar to those of the fourth embodiment are denoted by the same reference signs and a description thereof may be omitted partly or entirely.

The semiconductor device 1e of the present embodiment is similar to the semiconductor device 1d of the fourth embodiment and includes a first internal block circuit 11A, a second internal block circuit 11B and an analog switch 41. The first internal block circuit 11A has the same configuration as the internal block circuit 11 of the fourth embodiment. The second internal block circuit 11B has the same configuration as the second internal block circuit 11B of the third embodiment.

The first terminal of the analog switch 41 is connected to the second internal block circuit 11B, and the second terminal of the analog switch 41 is connected to a node N1 between the first resistor 12 and the first transistor 14A. The inverting control terminal of the analog switch 41 is connected to the control terminal (gate) of the second transistor 14B.

The semiconductor device 1e additionally includes a switching control circuit 20C that controls each of the first transistor 14A, the second transistor 14B and the analog switch 41 to be on and off. The switching control circuit 20C is electrically connected to the first test circuit 20A and the second test circuit 20B, and controls the on and off of the first transistor 14A, the second transistor 14B and the analog switch 41 based on the combinations of the test signals applied to the third external terminal 33 and the fifth external terminal 35, as shown in Table 1 below.

TABLE 1

Table 1 shows the state of each test signal input to the third external terminal 33 and the fifth external terminal 35. The state "0" indicates that the test signal is not applied, and the state "1" indicates that the test signal is applied

| | Test Signal Input | | Switching Control | | |
|---|---|---|---|---|---|
| Mode | Test Signal to Third External Terminal | Test Signal to Fifth External Terminal | First Transistor | Second Transistor | Analog Switch |
| Normal Mode | 0 | 0 | ON | ON | OFF |
| First Test Mode | 0 | 1 | OFF | ON | OFF |
| Second Test Mode | 1 | 1 | OFF | OFF | OFF |
| Third Test Mode | 1 | 0 | OFF | OFF | ON |

The following describes operation of the semiconductor device 1e. The semiconductor device 1e has a normal mode for normal operation, a first test mode for product identification of the semiconductor device 1e by the resistance measuring device 100, a second test mode for measurement of the leakage current in the first internal block circuit 11A, and a third test mode for measurement of the internal voltage of the second internal block circuit 11B. The operation mode is selected by combination of the test signals provided to the third external terminal 33 and the fifth external terminal 35, from among the four operation modes, including the normal mode, the first test mode, the second test mode and the third test mode.

The normal mode, the first test mode and the second test mode of the semiconductor device 1e will not be described as they are basically similar to the normal mode, the first test mode and the second test mode of the fourth embodiment. The difference lies in that the operation of the analog switch 41 is additionally involved. That is, in the normal mode and the first test mode, the second transistor 14B is turned on, and thus the analog switch 41 is turned off in the normal mode, the first test mode and the second test mode. In the first test mode, a test signal is applied only to the fifth external terminal 35. In the second test mode, a test signal is applied to both the third external terminal 33 and the fifth external terminal 35.

In the third test mode, the source voltage VCC is applied to the fourth external terminal 34. In the third test mode, a test signal is applied only to the third external terminal 33. As a result, the first wiring 17 is disconnected from the second wiring 18. At the same time, the second internal block circuit 11B is active, so that the internal voltage of the second internal block circuit 11B is applied via the analog switch 41 to the node N1 between the first resistor 12 and the transistor 14. Thus, the internal voltage appears at the first external terminal 31. The voltage measuring device (not shown) can measure the internal voltage of the second internal block circuit 11B by measuring the voltage between the first external terminal 31 and the second external terminal 32. As shown above, the method of testing the semiconductor device 1e in the third test mode includes a first step of turning off the first transistor 14A and the second transistor 14B and the turning on the analog switch 41, and a second step of detecting the voltage of the second internal block circuit 11B based on the voltage between the first external terminal 31 and the second external terminal 32.

The present embodiment can achieve the following advantages in addition to those achieved by the fourth embodiment.

(5-1) In the third test mode, both of the first transistor 14A and the second transistor 14B are turned off, and the internal voltage of the second internal block circuit 11B is applied to the node N1. In this state, the internal voltage of the second internal block circuit 11B is not affected by the first resistor 12 and the second resistor 13, and thus can be measured accurately.

Configuration Examples of Semiconductor Devices 1a to 1e of First to Fifth Embodiments With reference to FIGS. 8 to 14, a power module 50 is described as an example of a specific configuration for implementing the semiconductor devices 1a to 1e of the first to fifth embodiments. The power module 50 can be used in various driver circuits, including an inverter circuit for driving a compressor in an air conditioner outdoor unit, an inverter circuit for driving a refrigerator compressor, and an inverter circuit for driving a fun. The driver circuit may drive a 3-phase AC motor, for example.

Figure 8:
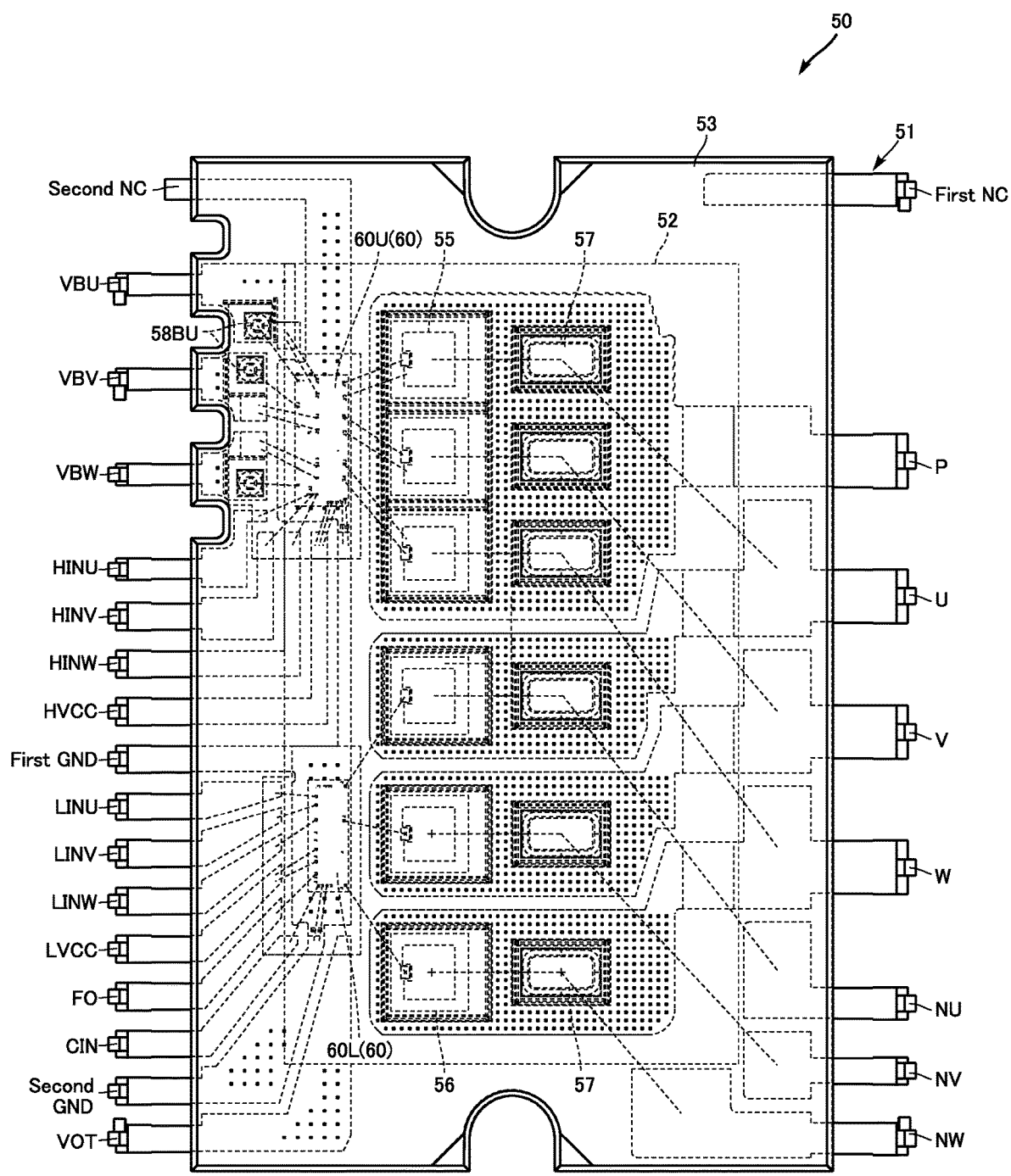
FIG. 8 is a plan view of a power module having a semiconductor device.
Figure 9:
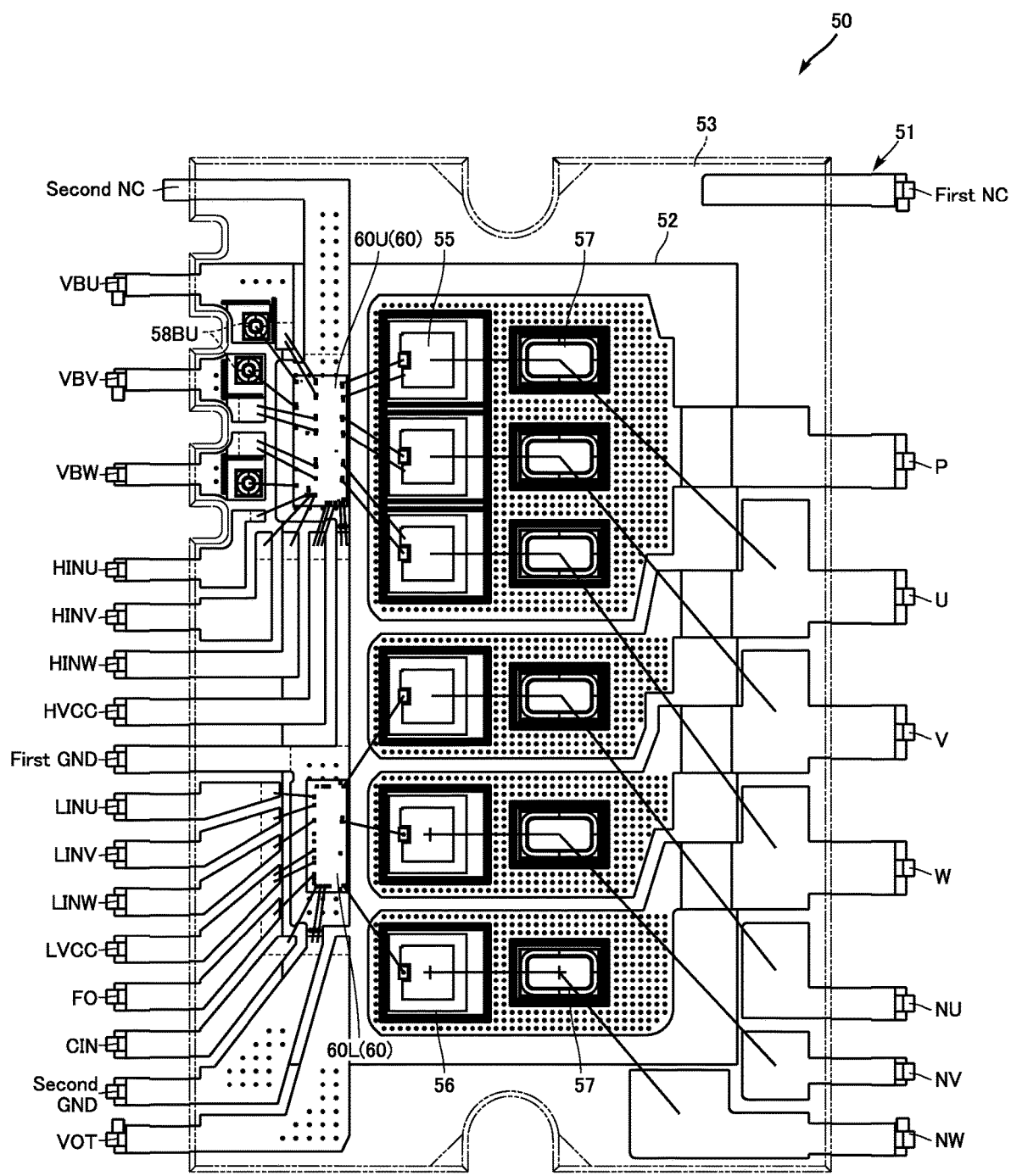
FIG. 9 is a fragmentary plan view of a power module having a semiconductor device.
Figure 10:
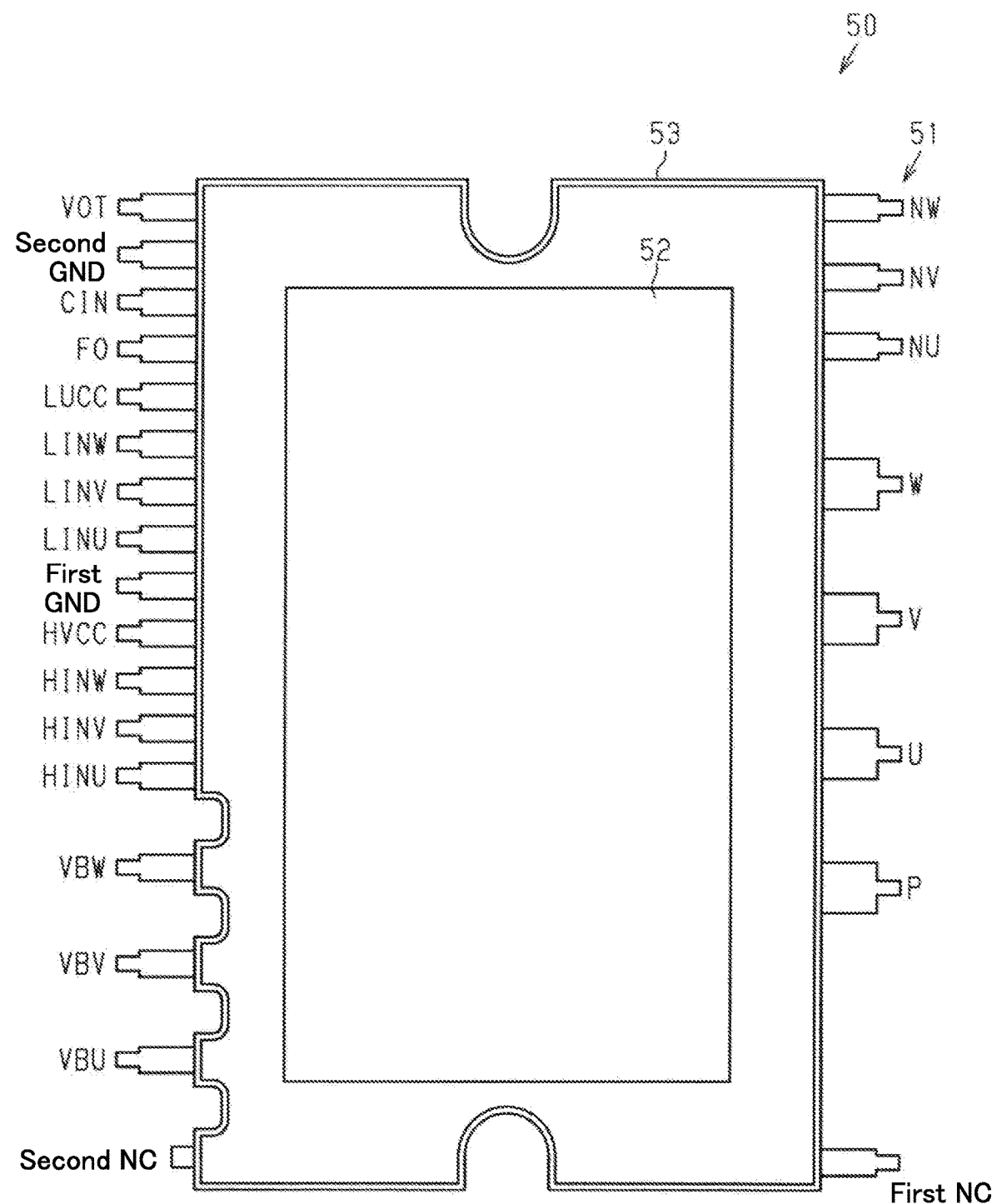
FIG. 10 is a bottom view of a power module having a semiconductor device.
Figure 11:
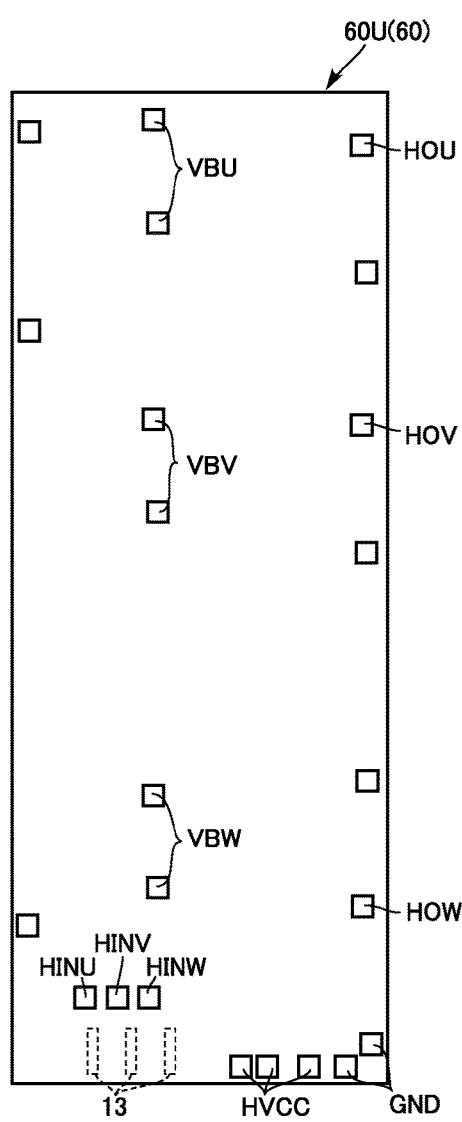
FIG. 11 is a plan view of an upper switch drive of a semiconductor device.
Figure 12:
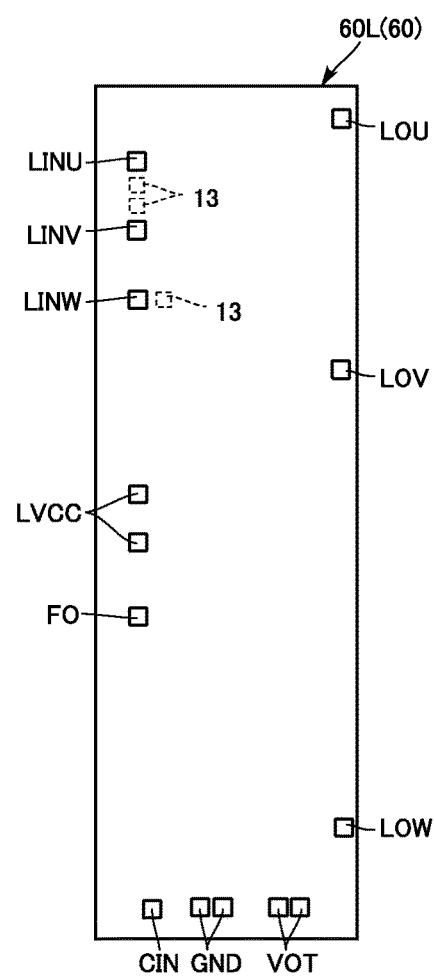
FIG. 12 is a plan view of a lower switch drive of a semiconductor device.

FIG. 8 is a plan view of the power module 50. FIG. 9 is a fragmentary plan view of the power module 50, showing a later-described sealing resin 53 in phantom. FIG. 10 is a bottom view of the power module 50. FIG. 11 is a plan view of an upper switch drive 60U of the power module 50. FIG. 12 is a plan view of a lower switch drive 60L of the power module 50. As shown in FIGS. 8 to 10, the power module 50 includes a plurality of leads 51, a cooling plate 52 and the sealing resin 53. The sealing resin 53 has a rectangular shape in plan view. In one example, the sealing resin 53 has a longitudinal length of 38 mm, a width of 24 mm (in a direction perpendicular to the longitudinal direction of the sealing resin 53), and a thickness of 3.5 mm. The plurality of leads 51 extend out from the longitudinal sides of the sealing resin 53. Each lead 51 is substantially in the shape of L as seen from the direction perpendicular to the longitudinal direction. The cooling plate 52 is exposed on a surface of the sealing resin 53 facing in the direction of thickness. The exposed surface of the cooling plate 52 is rectangular in plan view, with the longitudinal direction coinciding with the longitudinal direction of the sealing resin 53.

Each of the plurality of leads 51, which extends out of the sealing resin 53, has a terminal for connection with a non-illustrated circuit board when the power module 50 is mounted on the circuit board. In one example, the terminals of the plurality of leads 51 include P, U, V, W, NU, NV, NW, VBU, VBV, VBW, HINU, HINV, HINW, HVCC, first GND, LINU, LINV, LINW, LVCC, FO, CIN, second GND, VOT, first NC and second NC terminals.

Figure 13:
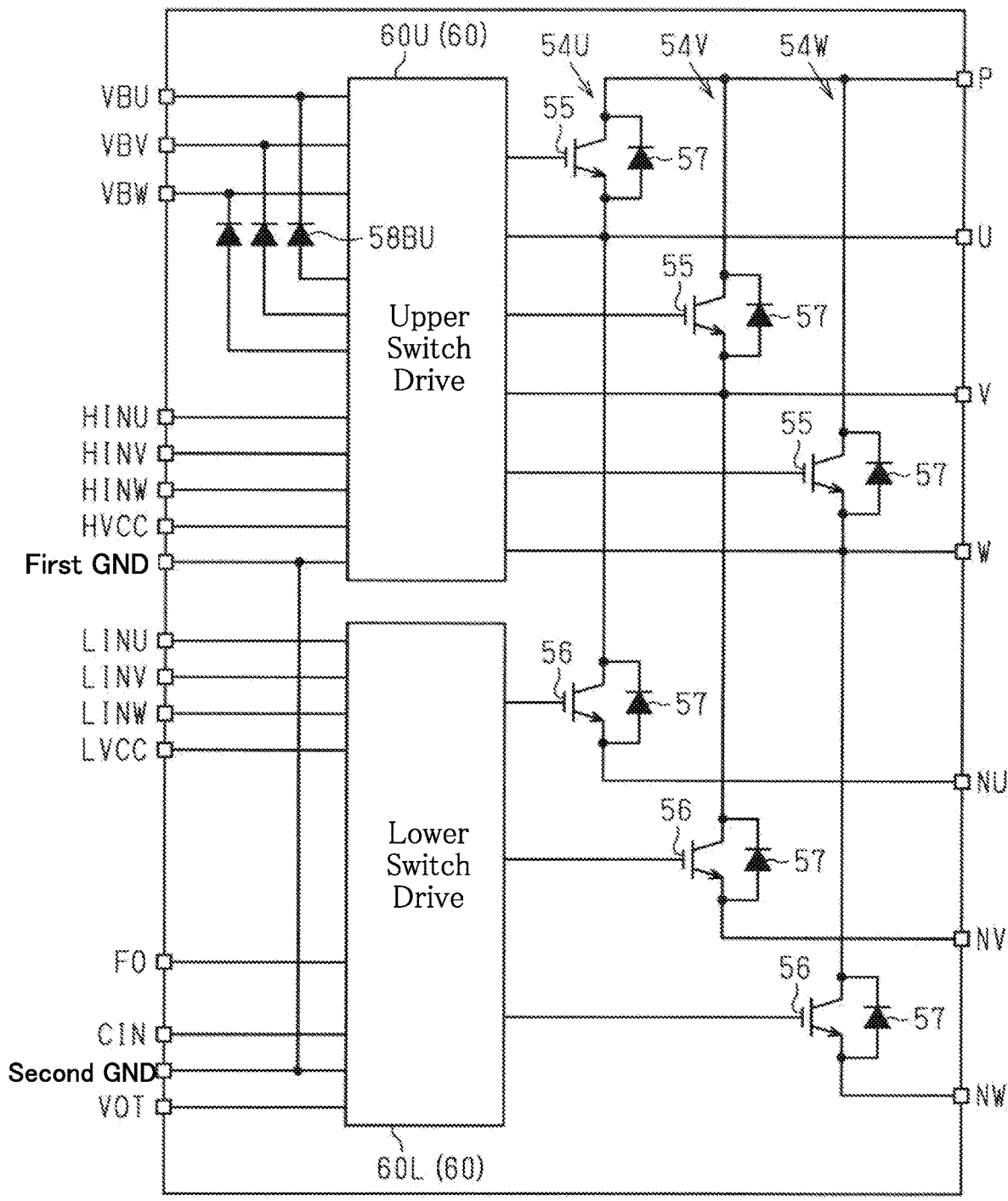
FIG. 13 is a schematic circuit diagram of the power module shown in FIG. 8.

As shown in FIG. 13, the power module 50 includes a U-phase switching arm 54U, a V-phase switching arm 54V, a W-phase switching arm 54 and a control circuit 60 for controlling these switching arms 54U, 54V and 54W. The U-phase switching arm 54U, the V-phase switching arm 54V and the W-phase switching arm 54 are connected in parallel to each other. The control circuit 60 includes an upper switch drive 60U and a lower switch drive 60L.

Each of the switching arms 54U, 54V and 54W includes an upper switching element 55 and a lower switching element 56. The upper switching element 55 and the lower switching element 56 are serially connected. The upper switching element 55 has a first terminal to which the source voltage is fed, a second terminal connected to the lower switching element 56, and a control terminal. The lower switching element 56 has a first terminal connected to the second terminal of the upper switching element 55, a second terminal connected to ground, and a control terminal. In one example, the upper switching element 55 and the lower switching element 56 may be IGBTs. Each of the upper switching element 55 and the lower switching element 56 is connected to a diode 57. In one example, the diode 57 may be a fast recovery diode.

In the switching arms 54U, 54V and 54W, the collectors of the respective upper switching elements 55 are connected to each other and electrically connected to the P terminal. The P terminal is used to feed the drive voltage VDD to the upper switching elements 55. In the U-phase switching arm 54U, the emitter of the upper switching element 55 and the collector of the lower switching element 56 are electrically connected to the U terminal. In addition, the emitter of the lower switching element 56 is electrically connected to the NU terminal. The U terminal is an output terminal of the U-phase switching arm 54U. In the V-phase switching arm 54V, the emitter of the upper switching element 55 and the collector of the lower switching element 56 are electrically connected to the V terminal. In addition, the emitter of the lower switching element 56 is electrically connected to the NV terminal. The V terminal is an output terminal of the V-phase switching arm 54V. In the W-phase switching arm 54W, the emitter of the upper switching element 55 and the collector of the lower switching element 56 are electrically connected to the W terminal. In addition, the emitter of the lower switching element 56 is electrically connected to the NW terminal. The W terminal is an output terminal of the W-phase switching arm 54W. The gate of each upper switching element 55 is connected to the upper switch drive 60U, and the gate of each lower switching element 56 is connected to the lower switch drive 60L.

As shown in FIGS. 9 and 11, the upper switch drive 60U is electrically connected to the VBU, VBV, VBW, HINU, HINV, HINW, HVCC and first GND terminals. The HVCC terminal is used to feed the source voltage VCC to the upper switch drive 60U. The HINU terminal, the HINV terminal and the HINW terminal receive a gate signal voltage applied from an external gate driver circuit (not shown). The upper switch drive 60U applies the received gate signal voltages to the gates of the upper switching elements 55.

As shown in FIGS. 11, the upper switch drive 60U has pads for electrical connection with the VBU, VBV, VBW, HINU, HINV, HINW, HVCC and first GND terminals. These pads may include those arrayed along an outer edge of the upper switch drive 60U or those located near the central part of the upper switch drive 60U in plan view.

The upper switch drive 60U shown in the figure includes a plurality of second resistors 13, which are described with reference to FIGS. 1 and 2. In the example shown in FIG. 11, the second resistors 13 are arranged along the direction in which the pads are arranged for connection with the HVCC terminals. In addition, the second resistors 13 are vertically adjacent to the pads for the HINU, HINV and HINW terminals as viewed in the figure.

The lower switch drive 60L is electrically connected to the LINU, LINV, LINW, LVCC, FO, CIN, second GND and VOT terminals. The LVCC terminal is used to feed the source voltage VCC to the lower switch drive 60L. The LINU, LINV and LINW terminals receive a gate signal voltage applied from an external gate driver circuit. The lower switch drive 60L applies the received gate signal voltages to the gates of the lower switching elements 56.

As shown in FIG. 12, the lower switch drive 60L has pads for electrical connection with the LINU, LINV, LINW, LVCC, FO, CIN, second GND and VOT terminals. The pads may include those arranged along an outer edge of the lower switch drive 60L.

The lower switch drive 60L shown in the figure includes a plurality of second resistors 13, which are described with reference to FIGS. 1 and 2. In the example shown in FIG. 12, two of the second resistor 13 are arranged between pads for the LINU and LINV terminals. In addition, one second resistor 13 is arranged on the right of the pad for the LINW terminal as viewed in the figure.

Figure 14:
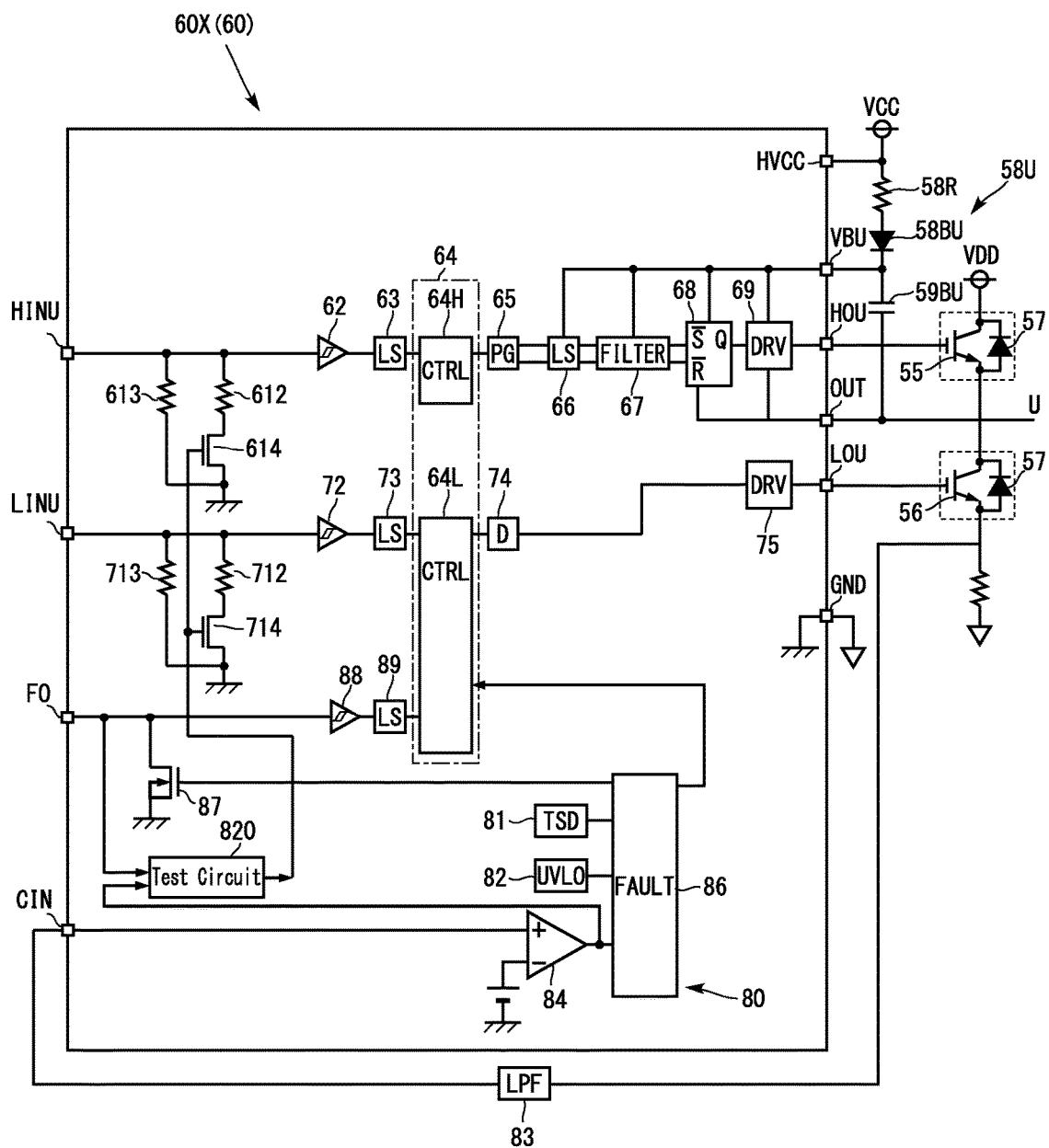
FIG. 14 is a circuit diagram representing a part of the circuitry of the power module shown in FIG. 8.

FIG. 14 shows an example configuration for implementing the upper switch drive 60U and the lower switch drive 60L that drive the U-phase switching arm 54U. FIG. 14 shows an example of the circuitry (hereinafter, "control circuit 60X") of the upper switch drive 60U and the lower switch drive 60L, for controlling the U-phase switching arm 54U.

As shown in FIG. 14, a portion of the control circuit 60X that corresponds to the upper switch drive 60U includes, in order from the input (HINU terminal) to the output (HOU terminal), a first resistor 612, a second resistor 613, a transistor 614, a Schmitt trigger 62, a level shifter 63, a controller 64, a pulse generator 65, a level shifter 66, a filter circuit 67, an RS flip-flop circuit 68 and a driver 69.

The first resistor 612 and the second resistor 613 pull down the HINU terminal toward ground. Thus, when the HINU terminal is open, an upper input signal HINU inputted from the gate drive circuit as a gate signal voltage turns to a low level (the logic level for turning off the upper switching element 55). This prevents the possibility that the upper switching element 55 is unintentionally turned on. The first resistor 612 and the second resistor 613 respectively correspond to the first resistor 12 and the second resistor 13 of the semiconductor devices 1a to 1e.

The transistor 614 corresponds to the transistor 14 of the semiconductor devices 1a to 1e. The transistor 614 acts as a switch to connect and disconnect the first resistor 612. The gate electrode of the transistor 614 is connected to a test circuit 820 which will be described later.

The Schmitt trigger 62 passes the upper input signal HINU inputted to the HINU terminal to the level shifter 63. The Schmitt trigger 62 has a threshold voltage exhibiting a specific hysteresis. This configuration can improve the resistance to noise.

The level shifter 63 shifts the output signal of the Schmitt trigger 62 to the suitable voltage level (VCC-GND) for input to the controller 64 and providing the resulting signal as output.

The controller 64 controls whether or not to pass the output signal of the level shifter 63 to the pulse generator 65 (and thus whether or not to activate the upper switching element 55), based on a fault signal from a fault protection unit 80 or an external signal from the FO terminal. In the example shown in the figure, the controller 64 includes an upper controller 64H and a lower controller 64L. The upper controller 64H is connected to the level shifter 63 and controls the upper switching element 55. In the power module 50 shown in FIGS. 8 to 12, the upper controller 64H is implemented as the upper switch drive 60U. In this example, a fault signal from the fault protection unit 80 to the controller 64 is inputted to the lower controller 64L but not to the upper controller 64H. Note, however, that the present disclosure is not limited to such a configuration. In an alternative configuration, a fault signal from the fault protection unit 80 may be input to the upper controller 64H.

The pulse generator 65 generates pulse signals, including an on-signal SON and an off-signal SOFF, according to the output signal from the controller 64. To be more specific, the pulse generator 65 changes the on-signal SON to a high level for the predetermined on-duration TON1, when triggered by a rising edge of the output signal from the controller 64. Also, the pulse generator 65 changes the off-signal SOFF to a high level for the predetermined off-duration TON2, when triggered by a falling edge of output signal from the controller 64. The output signal of the controller 64 (the signal responsive to the upper input signal HINU) as well as the on-duration TON1 and the off-duration TON2 are set to avoid that the on-signal SON and off-signal SOFF are concurrently high. That is, provided that the power module 50 operates normally, one of the on-signal SON and the off-signal SOFF is high and the other is low.

The level shifter 66 shifts the level of signals from a low-potential block including the pulse generator 65 to a level for a high-potential block including the filter circuit 67, the RS flip-flop circuit 68 and the driver 69. To be more specific, the level shifter 66 receives pulses of the on-signal SON and off-signal SOFF from the pulse generator 65, which belongs to the low-potential block. The level shifter 66 shifts the level of each signal and outputs the resulting signals as a first shifted signal and a second shifted signal to the filter circuit 67. The high-potential block operates between the boost voltage VBU applied at the VBU terminal and a switching voltage VS applied at the U terminal.

The filter circuit 67 filters the first shifted signal and the second shifted signal received from the level shifter 66 and outputs the resulting signals to the RS flip-flop circuit 68.

The RS flip-flop circuit 68 has a set terminal (S terminal), a reset terminal (R terminal) and an output terminal (Q terminal). The S terminal receives a set signal SSET, which is the first shifted signal after filtering by the filter circuit 67. The R terminal receives a reset signal SRESET, which is the second shifted signal after filtering by the filter circuit 67. The Q terminal outputs an output signal SQ. The RS flip-flop circuit 68 changes the output signal SQ to a high level when triggered by a falling edge of the set signal SSET, and changes the output signal SQ to a low level when triggered by a falling edge of the reset signal SRESET. The set signal SSET and the reset signal SRESET are both inputted from the level shifter 66.

As shown in FIG. 14, the driver 69 generates an upper output signal HOU responsive to the output signal of the RS flip-flop circuit 68 and outputs the upper output signal HOU to the gate of the upper switching element 55. The upper output signal HOU at the high level functions as the boost voltage VBU, and at the low level as the switching voltage VS.

A portion of the control circuit 60X that corresponds to the lower switch drive 60L includes, in order from the input (LINU terminal) to the output (LOU terminal), a first resistor 712, a second resistor 713, a transistor 714, a Schmitt trigger 72, a level shifter 73, a delay circuit 74 and a driver 75. In the present embodiment, the controller 64 of the upper switch drive 60U is provided between the level shifter 73 and the delay circuit 74. Note that the controller of the lower switch drive 60L may be provided separately from the controller 64 of the upper switch drive 60U. In this case, the controller of the lower switch drive 60L may be provided between the delay circuit 74 and the driver 75. This enables the controller to more promptly turn off the lower switching element 56 since the delay circuit 74 is not located on the way.

The first resistor 712 and the second resistor 713 pull down the LINU terminal toward ground. Thus, when the LINU terminal is open, a lower input signal LINU inputted from the gate driver circuit as a gate signal voltage is turned to a low level (the logic level for turning off the lower switching element 56). This prevents the possibility that the lower switching element 56 is unintentionally turned on. The first resistor 712 and the second resistor 713 respectively correspond to the first resistor 12 and the second resistor 13 of the semiconductor devices 1a to 1e. The resistance value of the resistor 71 equals the combined resistance of the first resistor 12 and the second resistor 13.

The transistor 714 corresponds to the transistor 14 of the semiconductor devices 1a to 1e. The transistor 714 acts as a switch to connect and disconnect the first resistor 712. The gate electrode of the transistor 714 is connected to a test circuit 820 which will be described later.

The Schmitt trigger 72 passes the lower input signal LINU inputted to the LINU terminal to the level shifter 73. The Schmitt trigger 72 has a threshold voltage exhibiting a specific hysteresis. This configuration can improve the resistance to noise.

The level shifter 73 shifts the output signal of the Schmitt trigger 72 to the suitable voltage level (VCC-GND) for input to the controller 64 and outputs the resulting signal.

The controller 64 controls whether or not to pass the output signal of the delay circuit 74 to the driver 75 (and thus whether or not to activate the lower switching element 56), in response to a fault signal from the fault protection unit 80 or an external fault signal from the FO terminal.

The lower controller 64L is connected to the level shifter 73 and controls the lower switching element 56. In the power module 50 shown in FIGS. 8 to 12, the lower controller 64L is implemented as the lower switch drive 60L.

The delay circuit 74 provides the output signal received from the controller 64 to the driver 75, with a predetermined time delay (corresponding to the circuit delay occurred in the pulse generator 65, the level shifter 66 and the RS flip-flop circuit 68 of the upper switch drive 60U).

Based on the output signal of the controller 64 delayed by the delay circuit 74, the driver 75 outputs a lower output signal LOU to the gate of the lower switching element 56. The lower output signal LOU at the high level functions as the source voltage VCC, and at the low level as the ground voltage VGND.

The fault protection unit 80 includes a thermal shutdown (TSD) circuit 81, an undervoltage lockout (UVLO) circuit 82, a low-pass filter circuit 83, a short-circuit protection circuit 84, a fault-signal generating circuit 86, a transistor 87, a Schmitt trigger 88 and a level shifter 89.

The thermal shutdown circuit 81 switches a thermal shutdown signal from the logic level indicating normal operation (e.g., low level) to the logic level indicating abnormal operation (e.g., high level), when the junction temperature at the lower switch driver IC of the power module 50 exceeds a preterminal threshold temperature.

The undervoltage lockout circuit 82 switches an undervoltage lockout signal from the logic level indicating normal operation (e.g., low level) to the logic level indicating abnormal operation (e.g., high level), when the source voltage VCC falls below a preterminal threshold voltage.

The low-pass filter circuit 83 is electrically connected to a sensing terminal CIN outside the power module 50. The low-pass filter circuit 83 outputs a detected voltage CIN. The detected voltage CIN is supplied to the short-circuit protection circuit 84 via the CIN terminal.

The short-circuit protection circuit 84 switches a short-circuit protection signal from the logic level indicating normal operation (e.g., low level) to the logic level indicating abnormal operation (e.g., high level), when the detected voltage CIN exceeds a preterminal threshold voltage.

The fault-signal generating circuit 86 monitors the thermal shutdown signal from the thermal shutdown circuit 81, the undervoltage lockout signal from the undervoltage lockout circuit 82, the short-circuit protection signal from the short-circuit protection circuit 84 and the external fault signal from the FO terminal. Upon occurrence of a fault in any of the thermal shutdown circuit 81, the undervoltage lockout circuit 82 and the short-circuit protection circuit 84 or upon receipt of an external fault signal, the fault-signal generating circuit 86 changes the fault signal from the logic level indicating normal operation (e.g., low level) to the logic level indicating abnormal operation (e.g., high level). The fault signal generated by the fault-signal generating circuit 86 is outputted to the lower controller 64L in the controller 64.

In response to the fault signal, the controller 64 may limit the current flowing through at least one of the upper switching element 55 and the lower switching element 56.

The transistor 87 serves as an open-drain output stage for outputting an external fault signal via the FO terminal. The transistor 87 may be an NMOSFET, for example. While no fault occurs in the power module 50, the fault-signal generating circuit 86 turns off the transistor 87. As a result, the external fault signal is switched to a high level. On the other hand, when a fault is found in the power module 50, that is, when at least one of the thermal shutdown circuit 81, the undervoltage lockout circuit 82 and the short-circuit protection circuit 84 detects a fault, the fault-signal generating circuit 86 turns on the transistor 87. As a result, the external fault signal is switched to a low level.

The Schmitt trigger 88 passes an external fault signal (for example, an external fault signal outputted from the FO terminal of another power module 50) received at the FO terminal to the level shifter 89. The Schmitt trigger 88 has a threshold voltage with the specific hysteresis.

This configuration can improve the resistance to noise.

The level shifter 89 shifts the output signal of the Schmitt trigger 88 to the suitable voltage level (VCC-GND) for input to the controller 64 and outputs the resulting signal.

A bootstrap circuit 58U includes a bootstrap diode 58BU and a bootstrap capacitor 59BU. The anode of the bootstrap diode 58BU is connected via the resistor 58R to the terminal at which the source voltage VCC is applied. The bootstrap capacitor 59BU is connected between the cathode of the bootstrap diode 58BU and the emitter of the upper switching element 55. The bootstrap capacitor 59BU is electrically connected to the VBU terminal and the U terminal.

The test circuit 820 corresponds to the test circuit 20 of the semiconductor devices 1a to 1e. The test circuit 20 receives the output signal from the short-circuit protection circuit 84 and the signal from the FO terminal. The output signal of the test circuit 820 is inputted to the gate electrodes of the transistors 614 and 714.

The bootstrap circuit 58U generates a boost voltage VB (drive voltage for the high-potential block including the driver 69) at the connection node (VB terminal) between the bootstrap diode 58BU and the bootstrap capacitor 59BU. The resistor 58R limits the current supplied from an external power source to the bootstrap diode 58BU via the HVCC terminal. In this way, the charging current supplied to the bootstrap capacitor 59BU is limited.

When the upper switching element 55 is off and the lower switching element 56 is on, the switching voltage VS appears at the low level (GND) at the U terminal. In this state, the electric current from the terminal at which the source voltage VCC is applied flows through the bootstrap diode 58BU, the bootstrap capacitor 59BU and the lower switching element 56. Thus, the bootstrap capacitor 59BU provided between the VBU terminal and the U terminal is charged. At this stage, the boost voltage VB appearing at the VBU terminal (i.e., the charging voltage of the bootstrap capacitor 59BU) is equal to the voltage value calculated by subtracting the forward-bias voltage drop Vf of the bootstrap diode 58Vf from the source voltage VCC (VCC−Vf).

On the other hand, when the upper switching element 55 is turned on and the lower switching element 56 is turned off while the bootstrap capacitor 59BU is being charged, the switching voltage VS is raised from the low level (GND) to the high level (HV). The boost voltage VB is raised from the high level (HV) of the switching voltage VS to a voltage level higher by the value corresponding to the charging voltage of the bootstrap capacitor 59BU (VCC−Vf) (=HV+ VCC−Vf). Thus, the boost voltage VB can be suitably used as the drive voltage of the high-potential block (RS flip-flop circuit 68 and the driver 69) or the level shifter 66 to control the on/off switching operation (on control, in particular) of the upper switching element 55.

Figure 15:
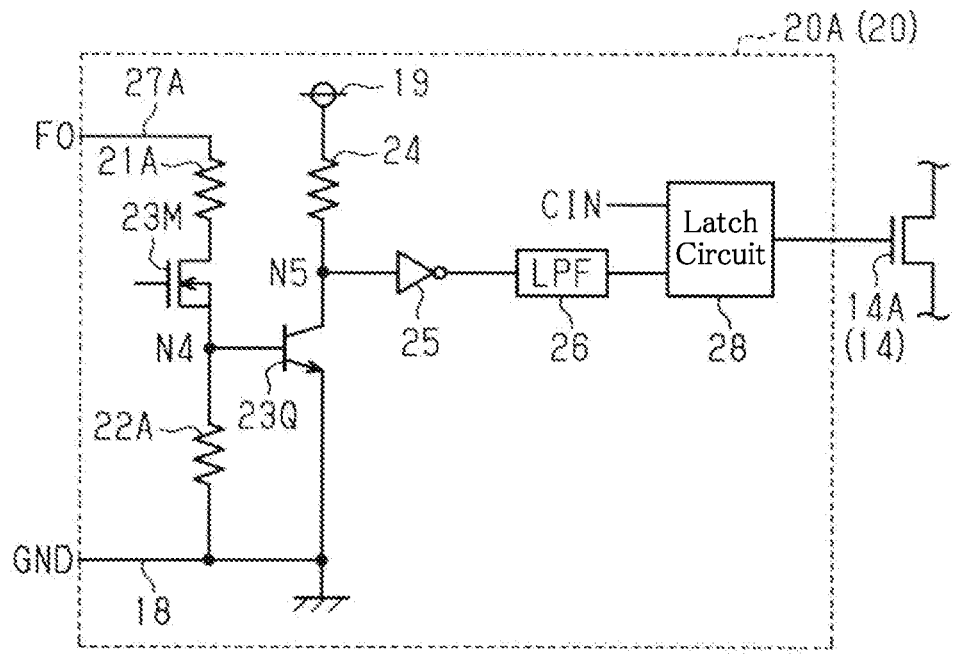
FIG. 15 is a circuit diagram showing an example of a first test circuit (test circuit).
Figure 16:
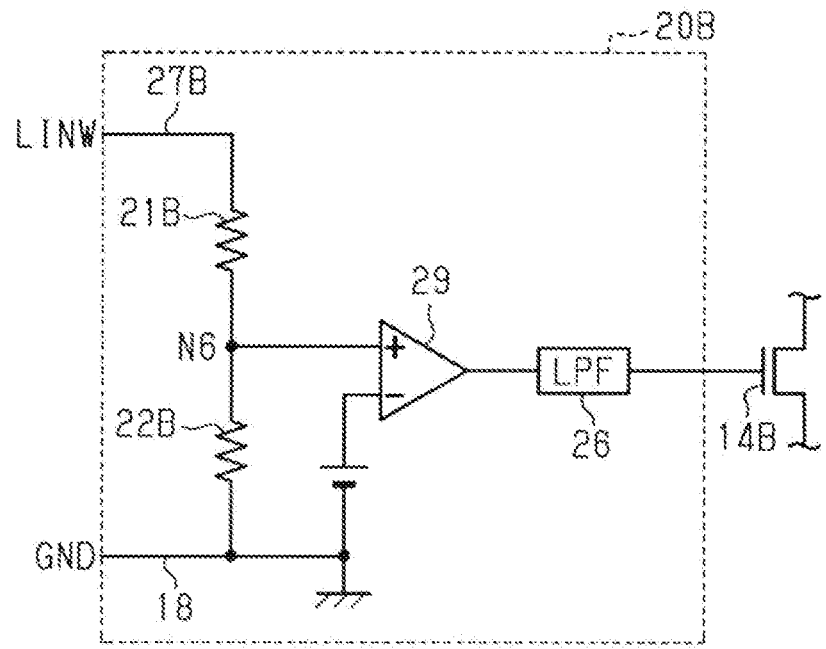
FIG. 16 is a circuit diagram showing an example of a second test circuit.

Configuration Example of First Test Circuit (Test Circuit) and Second Test Circuit With reference to FIGS. 15 and 16, the following describes a configuration example of the first test circuit (test circuit) and a configuration example of the second test circuit, which are used in the semiconductor devices 1a to 1e.

FIG. 15 shows an example configuration of the first test circuit 20A (test circuit 20). The test circuit 20 includes a first voltage divider resistor 21A, a second voltage divider resistor 22A, a bipolar transistor 230, a transistor 23M, a resistor 24, a NOT circuit 25, a filter circuit 26 and a latch circuit 28. The test circuit 20 removes noise from the test signal applied at the third external terminal 33 and outputs the resulting signal to the gate of the first transistor 14A (transistor 14). As shown in FIG. 15, one example of the third external terminal 33 is the FO terminal to which an external fault signal is inputted from the outside of the semiconductor devices 1a to 1e. The bipolar transistor 230 may be an NPN transistor, for example. The transistor 23M may be an NMOSFET, for example.

Each of the first voltage divider resistor 21A and the second voltage divider resistor 22A is serially connected with the transistor 23M between the wiring 27A, which is connected to the third external terminal 33, and the second wiring 18. To be more specific, a first terminal of the first voltage divider resistor 21A is connected to the wiring 27A, and a second terminal of the first voltage divider resistor 21A is connected to the drain of the transistor 23M. Also, a first terminal of the first voltage divider resistor 21A is connected to the source of the transistor 23M, and a second terminal of the second voltage divider resistor 22A is connected to the second wiring 18. As in the transistor 87 shown in FIG. 14, the gate of the transistor 23M is connected to the fault-signal generating circuit 86. Thus, the transistor 23M is turned on and off by the fault-signal generating circuit 86. In the test mode, applying a test signal to the CIN terminal thus turns on the transistor 23M.

The base of the bipolar transistor 23O is connected to the node N4 between the second terminal of the first voltage divider resistor 21A and the first terminal of the second voltage divider resistor 22A. The bipolar transistor 23O and the resistor 24 are serially connected between the third wiring 19 and the second wiring 18. To be more specific, a first terminal of the resistor 24 is connected to the third wiring 19, and a second terminal of the resistor 24 is connected to the collector of the bipolar transistor 23O. The emitter of the bipolar transistor 23Q is connected to the second wiring 18.

The input terminal of the NOT circuit 25 is connected to the node N5 connecting the second terminal of the resistor 24 and the collector of the bipolar transistor 23Q. The output terminal of the NOT circuit 25 is connected to the filter circuit 26. The filter circuit 26 may be a low-pass filter, for example.

The output terminal of the filter circuit 26 is connected to the latch circuit 28. The latch circuit 28 is connected to the CIN terminal to which the detected voltage CIN is inputted. The output terminal of the latch circuit 28 is connected to the gate of the transistor 14.

FIG. 16 shows an example configuration of the second test circuit 20B. The second test circuit 20B includes a first voltage divider resistor 21B, a second voltage divider resistor 22B, a filter circuit 26 and a comparator 29. The second test circuit 20B removes nose from the test signal applied at the fifth external terminal 35 and outputs the resulting signal to the gate of the second transistor 14B. In one example, the fifth external terminal 35 may be a LINW terminal from which the gate signal voltage is applied to the lower switching element 56 of the W-phase switching arm 54W in the semiconductor devices 1a to 1e.

The first voltage divider resistor 21B and the second voltage divider resistor 22B are serially connected between the wiring 27B, which is connected to the fifth external terminal 35, and the second wiring 18. To be more specific, a first terminal of the first voltage divider resistor 21B is connected to the wiring 27B, and a second terminal of the first voltage divider resistor 21B is connected to a first terminal of the second voltage divider resistor 22B. A second terminal of the second voltage divider resistor 22B is connected to the second wiring 18.

A first input terminal of the comparator 29 is connected to the node N6 connecting the second terminal of the first voltage divider resistor 21B and the first terminal of the second voltage divider resistor 22B. A second input terminal of the comparator 29 receives the reference voltage. The output terminal of the comparator 29 is connected to the filter circuit 26. The output terminal of the filter circuit 26 is connected to the gate of the second transistor 14B.

As described above, the first test circuit 20A (test circuit 20) and the second test circuit 20B are connected to the exiting terminals of the semiconductor devices 1a to 1e. That is, an additional resistor element can be added specifically for product identification, without requiring additional external terminals to be provided only for the purpose of product identification, and thus without undesirable size increase.

Variations

The embodiments have been described only for the purpose of illustrating possible implementations of the semiconductor device and the method for identifying a semiconductor device according to the present disclosure and not intended to impose limitations. The semiconductor device and the method for identifying a semiconductor device according to the present disclosure may be implemented by any of the following variations of the above-described embodiments or by any combination of two or more variations not conflicting with each other.

The configuration of the semiconductor device 1b according to the second embodiment may be employed in any of the third, fourth and fifth embodiments.

For example, the semiconductor device 1b of the second embodiment may have N number of second external terminals 32, instead of a single second external terminal 32.

The third embodiment may be provided with separate test circuits, one for controlling the on and off of the transistor 14, and another for the analog switch 41. This makes it possible to control the switching of the transistor 14 and the analog switch 41 separately.

In the fourth and fifth embodiments, a test signal for turning off the second transistor 14B may be inputted to the fifth external terminal 35 in the normal mode. In this case, the first resistor 12 provides a resistance value matching the predetermined resistance value of the semiconductor device 1d and 1e in the normal mode.

In each embodiment, the test circuit 20 (first test circuit 20A) may be any other circuit that turns on and off the transistor 14 (first transistor 14A), and is not limited to the circuit configuration shown in FIG. 2. In addition, the second test circuit 20B may be any other circuit that turns on and off the second transistor 14B and is not limited to the circuit configuration shown in FIG. 2. The test circuit 20 (first test circuit 20A) and the second test circuit 20B may be modified as shown in FIG. 17 or 18.

Figure 17:
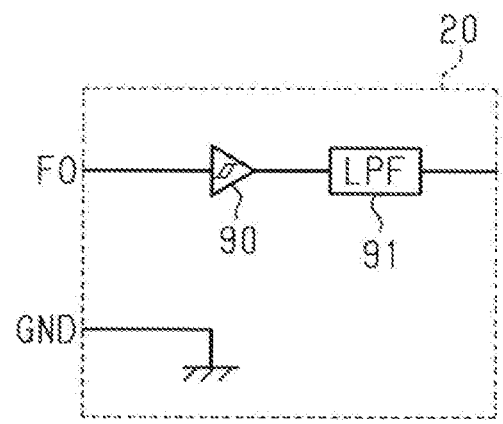
FIG. 17 is a circuit diagram showing an example of a test circuit according to a variation.

As shown in FIG. 17, the test circuit 20 (first test circuit 20A) and the second test circuit 20B may be modified to include a Schmitt trigger 90 and a filter circuit 91. The Schmitt trigger 90 passes a test signal from the third external terminal 33 to the control terminal of the transistor 14. The Schmitt trigger 90 has a threshold voltage with the specific hysteresis. This configuration can improve the resistance to noise. The output terminal of the Schmitt trigger 90 is connected to the filter circuit 91. The filter circuit 91 may be a low-pass filter, for example. Thus, the test signal applied at the third external terminal 33 is passed to remove noise and supplied to the control terminal of the transistor 14.

Figure 18:
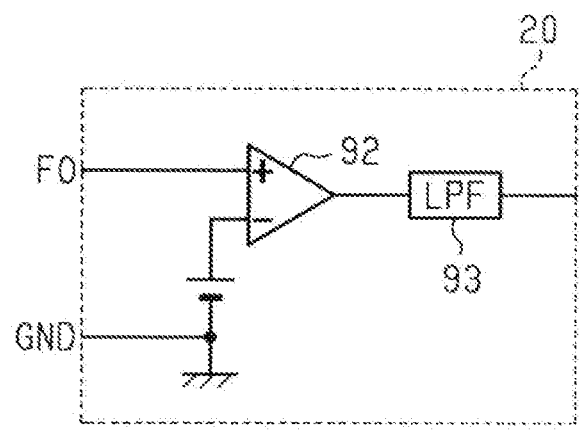
FIG. 18 is a circuit diagram showing an example of a test circuit according to a variation.

As shown in FIG. 18, the test circuit 20 (first test circuit 20A) and the second test circuit 20B may be modified to include an amplifier circuit 92 and a filter circuit 93. The amplifier circuit 92 has a first input terminal connected to the third external terminal 33. The amplifier circuit 92 receives a reference voltage applied at a second input terminal. The output terminal of the amplifier circuit 92 is connected to the filter circuit 93. The filter circuit 93 may be a low-pass filter, for example. Thus, the test signal applied at the third external terminal 33 is amplified by the amplifier circuit 92 and then noise is removed by the filter circuit 93. The resulting signal is supplied to the control terminal of the transistor 14.

In the embodiments described above, the semiconductor devices 1a to 1e may be provided with an internal control circuit that controls the on and off of the transistor 14 (first transistor 14A) and the second transistor 14B. Then, the test circuit 20 (first test circuit 20A) and the second test circuit 20B may be omitted. In this case, the third and fifth embodiments may be further provided with an analog switch changeover circuit (not shown) for controlling on and off of the analog switch 41.

Figure 19:
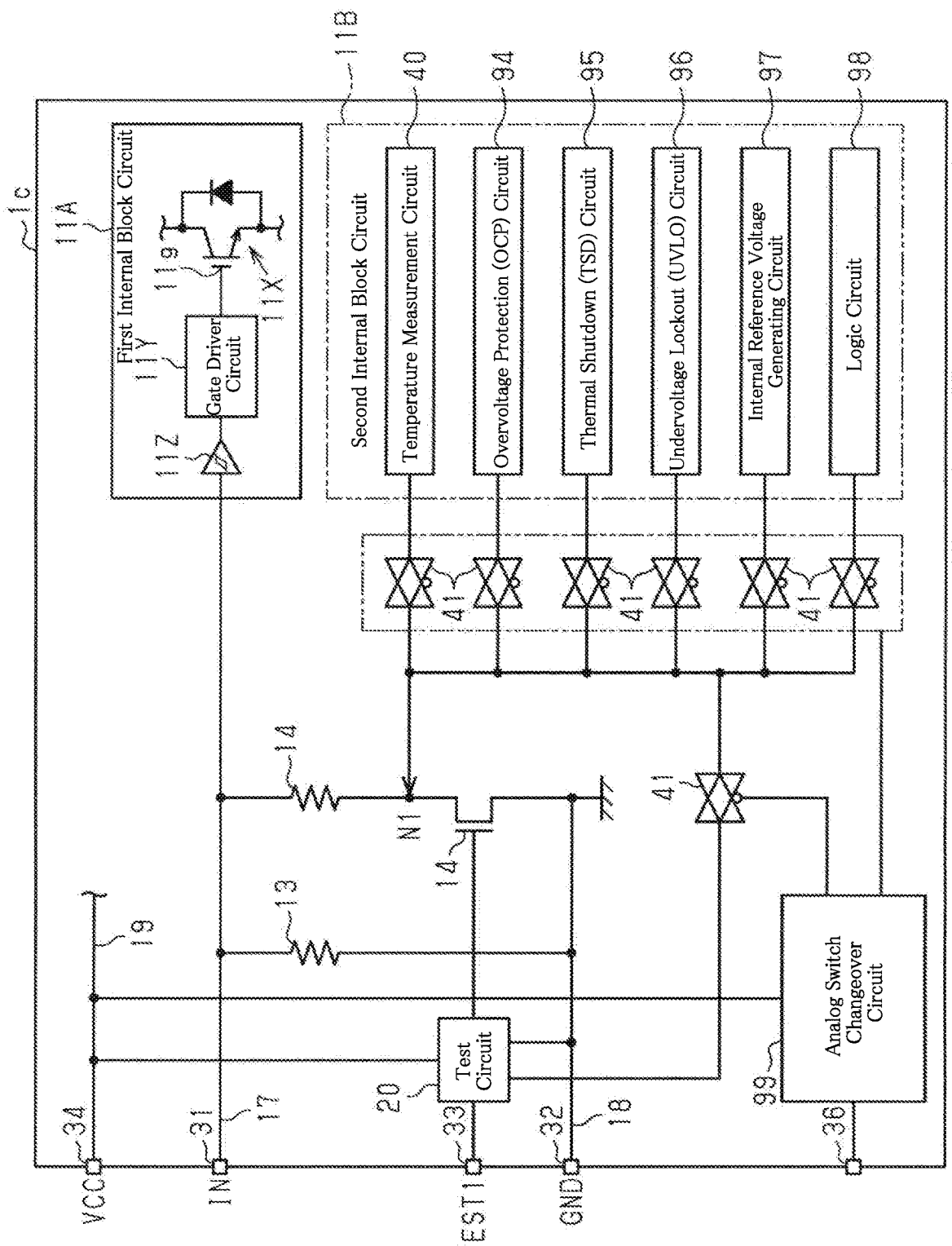
FIG. 19 is a circuit diagram of a semiconductor device according to a variation.

The third and fifth embodiments may be configured to measure the internal voltages of a plurality of circuits in the second internal block circuit 11B. In this case, each of the plurality of circuits may be provided with an analog switch 41 that operates according to the measured value of the internal voltage of the circuit. The individual analog switches 41 may be separately controlled to enable the internal voltages of the respective circuits to be measured. FIG. 19 shows one configuration example of the semiconductor device 1c of the third embodiment enabled to measure the internal voltages of a plurality of circuits in the second internal block circuit 11B. The second internal block circuit 11B includes a temperature measurement circuit 40, an overvoltage protection circuit 94, a thermal shutdown circuit 95, an undervoltage lockout circuit 96, an internal reference voltage generating circuit 97 and a logic circuit 98. An analog switch 41 is provided to each of the temperature measurement circuit 40, the overvoltage protection circuit 94, the thermal shutdown circuit 95, the undervoltage lockout circuit 96, the internal reference voltage generating circuit 97 and the logic circuit 98. Each analog switch 41 has a second terminal connected to the node N1 between the first resistor 12 and the transistor 14. Another analog switch 41 is provided to the test circuit 20 for measuring the internal voltage of the test circuit 20. This analog switch 41 has a second terminal connected to the node N1.

Turning on and off of the analog switches 41 is controlled by the analog switch changeover circuit 99. For example, the analog switch changeover circuit 99 may be provided within the semiconductor device 1c. The analog switch changeover circuit 99 is connected to a sixth terminal 36. The analog switch changeover circuit 99 outputs a control signal to the inverting control terminals of the respective analog switches 41. Alternatively, the analog switch changeover circuit 99 may be external to the semiconductor device 1c.

When the semiconductor device 1c of this variation operates in the third test mode, the analog switch changeover circuit 99 turns on the analog switch 41 of the circuit targeted for measurement and turns off the analog switches 41 of all the other circuits of the second internal block circuit 1B. In this way, the internal voltage of the targeted circuit can be measured by measuring the voltage at the first external terminal 31 and the second external terminal 32. The semiconductor device 1e may be modified in the same manner.

Clause 1. A semiconductor device comprising:
a first external terminal to which a first voltage is to be applied;
a second external terminal to which a second voltage is to be applied;
a third external terminal;
first wiring connected to the first external terminal;
second wiring connected to the second external terminal;
a first internal block circuit connected to the first wiring;
a first resistor and a first switching element serially connected between the first wiring and the second wiring; and
a second resistor connected between the first wiring and the second wiring,
wherein the first switching element turns on or off based on a test signal to be applied to the third external terminal.

Clause 2. The semiconductor device according to Clause 1, wherein the first external terminal is an input terminal to which a control signal for controlling the first internal block circuit is inputted.

Clause 3. The semiconductor device according to Clause 1 or 2, wherein a resistance value of the second resistor is larger than a resistance value of the first resistor.

Clause 4. The semiconductor device according to any one of Clauses 1 to 3, wherein the first switching element has a control terminal electrically connected to an external sensor terminal that produces an external output upon detection of a fault in the semiconductor device.

Clause 5. The semiconductor device according to any one of Clauses 1 to 4, wherein a length of the first wiring between the first external terminal and the first resistor is smaller than a length of the first wiring between the first external terminal and the second resistor.

Clause 6. The semiconductor device according to any one of Clauses 1 to 5, further comprising a test circuit that turns on and off the first switching element based on the test signal and that turns on the first switching element based on supply of a drive voltage.

Clause 7. The semiconductor device according to any one of Clauses 1 to 6, further comprising:
a switching unit connected to a node between the first resistor and the first switching element; and
a second internal block circuit electrically connected to the switching unit.

Clause 8. The semiconductor device according to Clause 7, wherein the second internal block circuit includes a temperature measurement circuit.

Clause 9. The semiconductor device according to Clause 7 or 8, further comprising a test circuit that turns on and off each of the first switching element and the switching unit based on the test signal, wherein the test circuit has:
a first test mode of turning on the first switching element and turning off the switching unit based on the test signal;
a second test mode of turning off the first switching element and turning on the switching unit based on the test signal; and
a normal mode of turning on the first switching element and turning off the switching unit based on supply of a drive voltage.

Clause 10. The semiconductor device according to any one of Clauses 1 to 8, further comprising a second switching element connected between the second resistor and the second wiring.

Clause 11. The semiconductor device according to Clause 10, wherein the second switching element has a control terminal electrically connected to an external terminal other than any of the external sensor terminal that produces an external output upon detection of a fault in the semiconductor device, the first external terminal and the second external terminal.

Clause 12. The semiconductor device according to Clause 10 or 11, further comprising:
a first test circuit that turns on and off the first switching element based on the test signal and that turns on the first switching element based on supply of a drive voltage; and
a second test circuit that turns on and off the second switching element based on the test signal and that turns on or off the second switching element based on supply of a drive voltage.

Clause 13. The semiconductor device according to Clause 12, further comprising:
a switching unit connected to a node between the first resistor and the first switching element; and
a second internal block circuit electrically connected to the switching unit,
wherein the first test circuit or the second test circuit turns on and off the switching unit based on the test signal,
the semiconductor device has a normal mode that is selected based on supply of a drive voltage, and a first test mode, a second test mode and a third test mode that are selected based on the test signal,
in the normal mode, the first switching element is turned on, the second switching element is turned on or off, and the switching unit is turned off,
in the first test mode, the first switching element is turned off, the second switching element is turned on, and the switching unit is turned off,
in the second test mode, each of the first switching element and the second switching element is turned off, and the switching unit is turned on, and
in the third test mode, each of the first switching element, the second switching element and the switching unit is turned off.

Clause 14. The semiconductor device according to any one of Clauses 1 to 13, wherein the first internal block circuit includes a power transistor.

Clause 15. The semiconductor device according to any one of Clauses 1 to 14, wherein a plurality of sets each including the first external terminal, the second external terminal, the first wiring, the second wiring, the first internal block circuit, the first resistor, the second resistor and the first switching element are provided.

Clause 16. The semiconductor device according to Clause 15, wherein at least one of the plurality of first resistors has a different resistance value from a resistance value of the remaining first resistors, and at least one of the plurality of second resistors has a different resistance value from a resistance value of the remaining second resistors.

Clause 17. A semiconductor device comprising:
a first external terminal to which a first voltage is to be applied;
a second external terminal to which a second voltage is to be applied;
a third external terminal;
first wiring connected to the first external terminal;
second wiring connected to the second external terminal;
a first internal block circuit connected to the first wiring;
a first resistor and a first switching element serially connected between the first wiring and the second wiring; and
a second resistor connected between the first wiring and the second wiring.

Clause 18. A method for product identification of a semiconductor device of any one of Clauses 1 to 8 and 17, the method comprising:
a first step of turning off the first switching element; and
a second step of detecting a resistance value of the second resistor between the first external terminal and the second external terminal.

Clause 19. A method for product identification of a semiconductor device of any one of Clauses 7 to 9, the method comprising:
a first step of turning off the first switching element and turning on the switching unit; and
a second step of detecting a voltage of the second internal block circuit based on a voltage between the first external terminal and the second external terminal.

Clause 20. A method for product identification of a semiconductor device of any one of Clauses 10 to 13, the method comprising:
a first step of turning off the first switching element and turning on the second switching element; and
a second step of detecting a resistance value of the second resistor between the first external terminal and the second external terminal.

Clause 21. A method for product identification of a semiconductor device of any one of Clauses 10 to 13, wherein the semiconductor device further comprising:
a switching unit connected to a node between the first resistor and the first switching element; and
a second internal block circuit electrically connected to the switching unit,
the method comprising:
a first step of turning off each of the first switching element and the second switching element and turning on the switching unit; and
a second step of detecting a voltage of the second internal block circuit based on a voltage between the first external terminal and the second external terminal.

The invention claimed is:
1. A semiconductor device comprising:
a first external terminal;
a second external terminal to which a second voltage is to be applied;
first wiring connected to the first external terminal;
second wiring connected to the second external terminal;
a first internal block circuit connected to the first wiring;
a first resistor and a first switching element serially connected between the first wiring and the second wiring;
a second resistor connected between the first wiring and the second wiring; and
a test circuit configured to control a switching operation of the first switching element,
wherein the first external terminal is an input terminal to which a control signal to control the first internal block circuit is input,
the test circuit turns on or off the first switching element based on supply of a drive voltage, and
a length of the first wiring between the first external terminal and the first resistor is smaller than a length of the first wiring between the first external terminal and the second resistor.

2. The semiconductor device according to claim 1, wherein a resistance value of the second resistor is larger than a resistance value of the first resistor.

3. The semiconductor device according to claim 1, further comprising:
a switching unit connected to a node between the first resistor and the first switching element; and
a second internal block circuit electrically connected to the switching unit.

4. The semiconductor device according to claim 3, wherein the second internal block circuit includes a temperature measurement circuit.

5. The semiconductor device according to claim 3, further comprising a third external terminal connected to the test circuit, wherein the test circuit has:
- a first test mode of turning on the first switching element and turning off the switching unit based on a signal applied to the third external circuit;
- a second test mode of turning off the first switching element and turning on the switching unit based on a signal applied to the third external circuit; and
- a normal mode of turning on the first switching element and turning off the switching unit based on supply of a drive voltage.

6. A method for product identification of a semiconductor device of claim 3, the method comprising:
- a first step of turning off the first switching element and turning on the switching unit; and
- a second step of detecting a voltage of the second internal block circuit based on a voltage between the first external terminal and the second external terminal.

7. The semiconductor device according to claim 1, further comprising: a second switching element connected between the second resistor and the second wiring.

8. The semiconductor device according to claim 7, wherein the second switching element has a control terminal electrically connected to a fourth external terminal other than any of the first external terminal, the second external terminal and the third external terminal.

9. The semiconductor device according to claim 7, further comprising:
- a first test circuit that turns on the first switching element based on supply of a drive voltage; and
- a second test circuit that turns on or off the second switching element based on supply of a drive voltage.

10. The semiconductor device according to claim 9, further comprising:
- a switching unit connected to a node between the first resistor and the first switching element; and
- a second internal block circuit electrically connected to the switching unit,
- wherein the first test circuit and the second test circuit turn on and off the switching unit based on a signal applied to the third external terminal and a fourth external terminal respectively,
- the semiconductor device has a normal mode that is selected based on supply of a drive voltage, and a first test mode, a second test mode and a third test mode that are selected based on a signal applied to the third external terminal and the fourth external terminal,
- in the normal mode, the first switching element is turned on, the second switching element is turned on or off, and the switching unit is turned off,
- in the first test mode, the first switching element is turned off, the second switching element is turned on, and the switching unit is turned off,
- in the second test mode, each of the first switching element and the second switching element is turned off, and the switching unit is turned on, and
- in the third test mode, each of the first switching element, the second switching element and the switching unit is turned off.

11. A method for product identification of a semiconductor device of claim 7, the method comprising:
- a first step of turning off the first switching element and turning on the second switching element; and
- a second step of detecting a resistance value of the second resistor between the first external terminal and the second external terminal.

12. A method for product identification of a semiconductor device of claim 7, wherein the semiconductor device further comprising:
- a switching unit connected to a node between the first resistor and the first switching element; and
- a second internal block circuit electrically connected to the switching unit,
- the method comprising:
- a first step of turning off each of the first switching element and the second switching element and turning on the switching unit; and
- a second step of detecting a voltage of the second internal block circuit based on a voltage between the first external terminal and the second external terminal.

13. The semiconductor device according to claim 1, wherein the first internal block circuit includes a power transistor.

14. The semiconductor device according to claim 1, wherein a plurality of sets each including the first external terminal, the first wiring, the first internal block circuit, the first resistor, the second resistor and the first switching element are provided.

15. The semiconductor device according to claim 14, wherein
- a plurality of first resistors and a plurality of second resistors are present,
- at least one of the plurality of first resistors has a resistance value different from a resistance value of the remaining first resistors, and
- at least one of the plurality of second resistors has a resistance value different from a resistance value of the remaining second resistors.

16. A method for product identification of a semiconductor device of claim 1, the method comprising:
- a first step of turning off the first switching element; and
- a second step of detecting a resistance value of the second resistor between the first external terminal and the second external terminal.

* * * * *